United States Patent
Chen et al.

(10) Patent No.: US 11,740,415 B2
(45) Date of Patent: Aug. 29, 2023

(54) STRUCTURES AND PROCESS FLOW FOR INTEGRATED PHOTONIC-ELECTRIC IC PACKAGE BY USING POLYMER WAVEGUIDE

(71) Applicant: Taiwan Semiconductor Manufacturing Co., Ltd., Hsin-Chu (TW)

(72) Inventors: Yu-Hao Chen, Hinchu (TW); Hui-Yu Lee, Hsin-Chu (TW); Chung-Ming Weng, Hsin-Chu (TW); Jui-Feng Kuan, Zhubei (TW); Chien-Te Wu, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 74 days.

(21) Appl. No.: 17/320,596

(22) Filed: May 14, 2021

(65) Prior Publication Data
US 2022/0365294 A1    Nov. 17, 2022

(51) Int. Cl.
*G02B 6/42* (2006.01)
*G02B 6/122* (2006.01)
*H01L 25/16* (2023.01)

(52) U.S. Cl.
CPC .......... *G02B 6/4214* (2013.01); *G02B 6/1221* (2013.01); *G02B 6/4201* (2013.01); *G02B 6/4204* (2013.01)

(58) Field of Classification Search
CPC .. G02B 6/4214; G02B 6/1221; G02B 6/4204; G02B 6/4201; H01L 2221/68345; H01L 2221/68359
See application file for complete search history.

(56) References Cited

U.S. PATENT DOCUMENTS

| | | | |
|---|---|---|---|
| 11,177,219 B1 * | 11/2021 | Youn | H04B 10/40 |
| 2007/0287212 A1 | 12/2007 | Maxwell | |
| 2017/0047312 A1 * | 2/2017 | Budd | H01L 23/585 |
| 2017/0212318 A1 * | 7/2017 | Kuo | H01S 5/0237 |
| 2017/0351026 A1 * | 12/2017 | Lipson | G02B 6/1245 |
| 2018/0120524 A1 * | 5/2018 | Mathai | G02B 6/43 |
| 2020/0088960 A1 * | 3/2020 | Wang | G02B 6/4246 |
| 2022/0342150 A1 * | 10/2022 | Karhade | G02B 6/4274 |

* cited by examiner

*Primary Examiner* — Ryan A Lepisto
*Assistant Examiner* — Erin D Chiem
(74) *Attorney, Agent, or Firm* — Duane Morris LLP

(57) ABSTRACT

Disclosed are apparatus and methods for a silicon photonic (SiPh) structure comprising the integration of an electrical integrated circuit (EIC); a photonic integrated circuit (PIC) disposed on top of the EIC; two or more polymer waveguides (PWGs) disposed on top of the PIC and formed by layers of cladding polymer and core polymer; and an integration fan-out redistribution (InFO RDL) layer disposed on top of the two or more PWGs. The operation of PWGs is based on the refractive indexes of the cladding and core polymers. Inter-layer optical signals coupling is provided by edge-coupling, reflective prisms and grating coupling. A wafer-level system implements a SiPh structure die and provides inter-die signal optical interconnections among the PWGs.

20 Claims, 25 Drawing Sheets

US 11,740,415 B2

STRUCTURES AND PROCESS FLOW FOR INTEGRATED PHOTONIC-ELECTRIC IC PACKAGE BY USING POLYMER WAVEGUIDE

BACKGROUND

Fan out wafer level packaging is useful to provide more integrated solutions for the positioning of dies (or chips) on a wafer. Fan out wafer level packaging is an integrated circuit packaging technology, and an enhancement of standard wafer-level packaging (WLP) solutions. Fan out wafer level packaging can provide a smaller package footprint along with improved thermal and electrical performance compared to conventional packages, and can allow having higher number of contacts without increasing the die size. In recent solutions, WLP techniques have evolved to build packages with an integrated fan-out type redistribution layer (InFO RDL) and with dies embedded in wafer materials such as organic laminate or silicon.

A key part of a fan-out is the redistribution layer (RDL). RDLs are typically copper metal connection lines or routing layers that electrically connect one part of the package to another. RDLs depend on pins or solder bumps for connections to printed circuit boards. Solutions based on a traditional fan-out type redistribution layer can be limiting from a cost and space perspective and because of the performance of electrical interconnections of the RDL infrastructure within the wafer level package. However, RDLs are not well-suited to support optical interconnections that provide higher performance compared with the performance provided by electrical interconnections. Therefore, what is needed are more efficient methods to provide optical interconnections within a wafer level package that includes one or optical integrated circuits.

The information disclosed in this Background section is intended only to provide context for various embodiments of the invention described below and, therefore, this Background section can include information that is not necessarily prior art information (i.e., information that is already known to a person of ordinary skill in the art). Thus, work of the presently named inventors, to the extent the work is described in this background section, as well as aspects of the description that cannot otherwise qualify as prior art at the time of filing, are neither expressly nor impliedly admitted as prior art against the present disclosure.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of illustration.

FIG. 2I illustrates a reflective prism, in accordance with some embodiments of the present disclosure.

DETAILED DESCRIPTION OF EXEMPLARY EMBODIMENTS

Figure 1A:
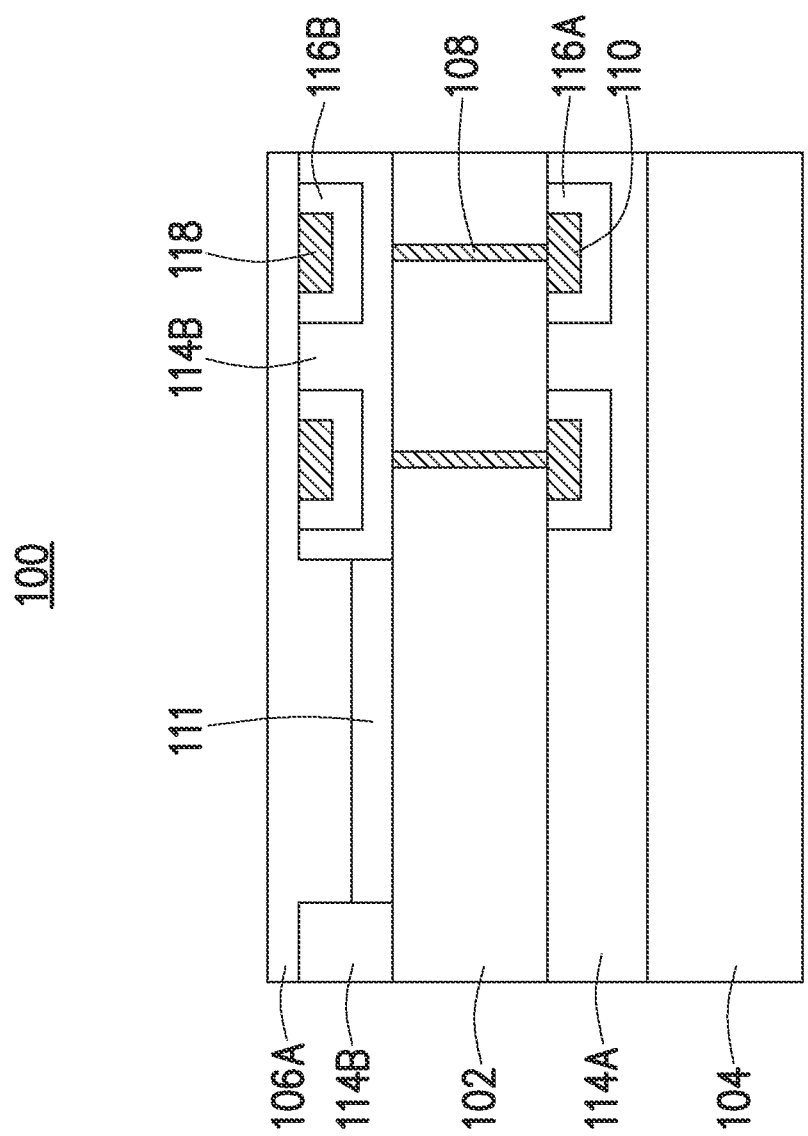
FIG. 1A illustrates a silicon photonic (SiPh) structure comprising a photonic integrated circuit (PIC), an electrical integrated circuit (EIC) and a cladding layer, in accordance with some embodiments.

Various exemplary embodiments of the present disclosure are described below with reference to the accompanying figures to enable a person of ordinary skill in the art to make and use the present disclosure. As would be apparent to those of ordinary skill in the art, after reading the present disclosure, various changes or modifications to the examples described herein can be made without departing from the scope of the present disclosure. Thus, the present disclosure is not limited to the exemplary embodiments and applications described and illustrated herein. Additionally, the specific order and/or hierarchy of steps in the methods disclosed herein are merely exemplary approaches. Based upon design preferences, the specific order or hierarchy of steps of the disclosed methods or processes can be re-arranged while remaining within the scope of the present disclosure. Thus, those of ordinary skill in the art will understand that the methods and techniques disclosed herein present various steps or acts in a sample order, and the present disclosure is not limited to the specific order or hierarchy presented unless expressly stated otherwise. In addition, the present disclosure may repeat reference numerals and/or letters in the various examples. This repetition is for the purpose of simplicity and clarity and does not in itself dictate a relationship between the various embodiments and/or configurations discussed.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present. Further, spatially relative terms, such as "beneath," "below," "lower,", "bottom", "underneath" "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures.

In accordance with some embodiments, a semiconductor packaging design includes integrated fan out (InFO), a wafer level system integration technology platform, and a high density RDL (Re-Distribution Layer). In some embodiments, TSVs (through-silicon vias) are included for high-density interconnect and performance for various applications, such as mobile, high performance computing, etc. The InFO platform offers various package schemes in 2D and 3D that are optimized for specific applications.

Embodiments described herein disclose structures and process flow for integrated photonic-electric IC packages by using polymer waveguides. With optical interconnections provided by polymer waveguides, substantially higher communication performance and more compact structures can be achieved in wafer level platforms, in accordance with various embodiments. These embodiments with polymer waveguides can be compatible with an InFO platform. Additionally, polymer waveguides can support inter-layer optical coupling in wafer-level systems. Techniques for inter-layer coupling include concave/bump, grating couplers and reflective prisms, in accordance with various embodiments.

Exemplary embodiments of integrated PIC packages by using polymer waveguides are described herein. Exemplary embodiments discussed herein, include the subjects of silicon photonics (SiPh), redistribution layer (RDL), Through-silicon via (TSV), photonic integrated circuit (PIC), polymer waveguides, optical refractive indexes and lithography. These subjects are briefly discussed below.

Silicon Photonics (SiPh) is a combination of the silicon integrated circuit and the semiconductor laser. It enables faster data transfer over longer distances compared to traditional electronics. SiPh techniques typically use silicon as a medium for optical signal transmission and can be a material platform for fabricating photonic integrated circuits (PICs). The silicon can be patterned with sub-micrometer precision into photonic components. A major advantage of SiPh include the potential to integrate optical and electronic devices within the same IC and its compatibility with the existing complementary metal-oxide semiconductor process (CMOS) for fabrication.

A photonic integrated circuit (PIC) or integrated optical circuit is a circuit that typically is integrated with an electronic integrated circuit (EIC). The PIC can generate an optical signal based on an input from an EIC, typically in the visible spectrum or near infrared 850 nm-1650 nm. Unlike electronic integration where silicon is the dominant material, system photonic integrated circuits have been fabricated from a variety of material systems, including electro-optic crystals such as lithium niobate, silica on silicon, Silicon on insulator, various polymers and semiconductor materials which are used to make semiconductor lasers such as GaAs and InP.

In integrated circuit design, a via is a small opening in an insulating oxide layer that allows a conductive connection between different layers. A through-silicon via (TSV) or through-chip via is a vertical electrical connection that passes completely through a silicon wafer or die. TSVs are high-performance interconnect techniques used as an alternative to wire-bond and flip chips to create 3D packages and 3D integrated circuits. Compared to alternatives, such as package-on-package, the interconnect and device density can be substantially higher, and the length of the connections can be reduced.

A redistribution layer (RDL) is an extra metal layer on a chip that makes the input/output pads of an integrated circuit available in other locations of the chip, for improved access to the pads where necessary. When an integrated circuit is fabricated, it can have a set of input/output pads that are wire bonded to the pins of the package. A redistribution layer can be an extra layer of wiring on the chip that enables bonding out from different locations on the chip, making chip-to-chip bonding simpler. Another example of the use for RDL is for spreading the contact points around the die so that solder balls can be applied, and the thermal stress of mounting can be spread. As a metal layer, the RDL supports electrical connections between many locations on an integrated circuit (IC) chip.

In accordance with various embodiments, optically transparent polymer waveguides (PWG) can be utilized for interfacing silicon photonics devices to optical fibers. Traditionally, the polymer waveguides are either processed onto the silicon photonics wafer or bonded to individual chips. Polymer waveguides typically are photo patternable materials that can be manufactured into complex optical routings on a small form factor. Polymer waveguides can comprise core layers and cladding layers. The polymer of a cladding layer will be different than the polymer of a core layer. With this difference, the refractive index can be lower in the cladding layers than the core layers, causing the light signal to transmit in the core layer, while bordered (or surrounded) by cladding layers. Cladding layers and core layers can have a thickness (or width) of 2 to 10 um. Additionally, the core layers can be a ladder shape in order to support multi-mode signal transmission. As discussed herein, a "cladding layer" is equivalent to a "layer of cladding polymer". Similarly, the term "core layer" is equivalent to a "layer of core polymer".

In optics, the refractive index (also known as refraction index or index of refraction) of a material is a dimensionless number that describes how fast light travels through the material. It is defined as N=c/v, where c is the speed of light in vacuum and v is the phase velocity of light in the medium. For example, the refractive index of water is 1.333, meaning that light travels 1.333 times slower in water than in a vacuum. Increasing the refractive index corresponds to decreasing the speed of light in the material. A typical polymer has a refractive index of 1.30-1.70, but a higher refractive index is often required for specific applications. Polymer waveguides can be designed based on a refractive index range of 1.3 to 2.0. In accordance with various embodiments, the polymer can be modified with different refractive indexes to form different cladding/core structures for polymer optical waveguide In accordance with various embodiments, lithography can be utilized to pattern layers for cladding layers and core layers of a PWG, pattern openings for vias, pattern openings for TSVs and patterns to guide a light signal to different locations. With lithography and photoresist coatings, concave/bump topology can be formed on layers for cladding polymer and core polymer.

FIG. 1A illustrates a silicon photonic (SiPh) structure 100 that includes a photonic integrated circuit (PIC) 102, an electrical integrated circuit (EIC) 104 and a first cladding layer 106A, a plurality of through-silicon vias (TSVs) 108, first metal contacts 110 disposes in a first passivation layer 114A, second metal contacts 118 disposed in a second passivation layer 114B, and a third passivation layer 116A disposed in the first passivation layer 114A and surrounding the first metal contacts 110, and a fourth passivation layer 116B disposed in the second passivation layer 114B and surrounding the second metal contacts 118, in accordance with some embodiments. As shown in FIG. 1A, EIC 104 is disposed beneath the first passivation layer 114A, which in turn is disposed beneath the PIC 102, which in turn is disposed beneath an edge coupler 111, which in turn is disposed beneath the cladding layer 106. As shown in FIG. 1A, the edge coupler 111 is disposed above the PIC 102 between portions of the second passivation layer 114B, and will be discussed in further detail below.

In accordance with various embodiments, the cladding layer 106A and 106B can be utilized as a waveguide's cladding, and the EIC 104 and PIC 102 can provide the electrical and photonic functions, respectively, for an integrated photonic-electric IC package, as described in further detail below.

In some embodiments, the TSVs 108 have a diameter in the range of 1-3 micrometers (μm). For example, in some embodiments, each TSV 108 has a diameter of 2 μm. Although FIG. 1A illustrates only two TSVs 108, two first metal structures 110 and two second metal structures 118, it is understood that any desired number of TSVs 108, first metal structures 110 and second metal structures 118 can be formed in the PIC 102. Each TSV 108 electrically couples one of the metal structures 110 to one of the metal structures 118. In some embodiments, the TSVs 108, metal structures 110 and metal structures 118 can be formed with gold. TSV 108 allows a conductive connection between conductive structures in two or more of the different layers of the SiPh structure 100, for example but without limitation, PIC 102, EIC 104, and the first and second passivation layers 114A and 114B. As discussed in further detail below, after subsequent process steps, the TSVs 108 can facilitate electrical connection between the EIC 104 and solder bumps of the SiPh structure 100, in accordance with various embodiments.

In some embodiments, the first, second, third and fourth passivation layers 114A, 114B, 116A and 116B each include a silicon nitride material. In some embodiments, the density of the silicon nitride material in the third and fourth passivation layers 116A and 116B is less than that of the first and second passivation layers 114A and 114B. Thus, by surrounding each of the metal structures 110 and 118 with the third and fourth passivation layers 116A and 116B, respectively, mechanical stress adjacent to metal structures 110 and 118 can be released.

Figure 1B:
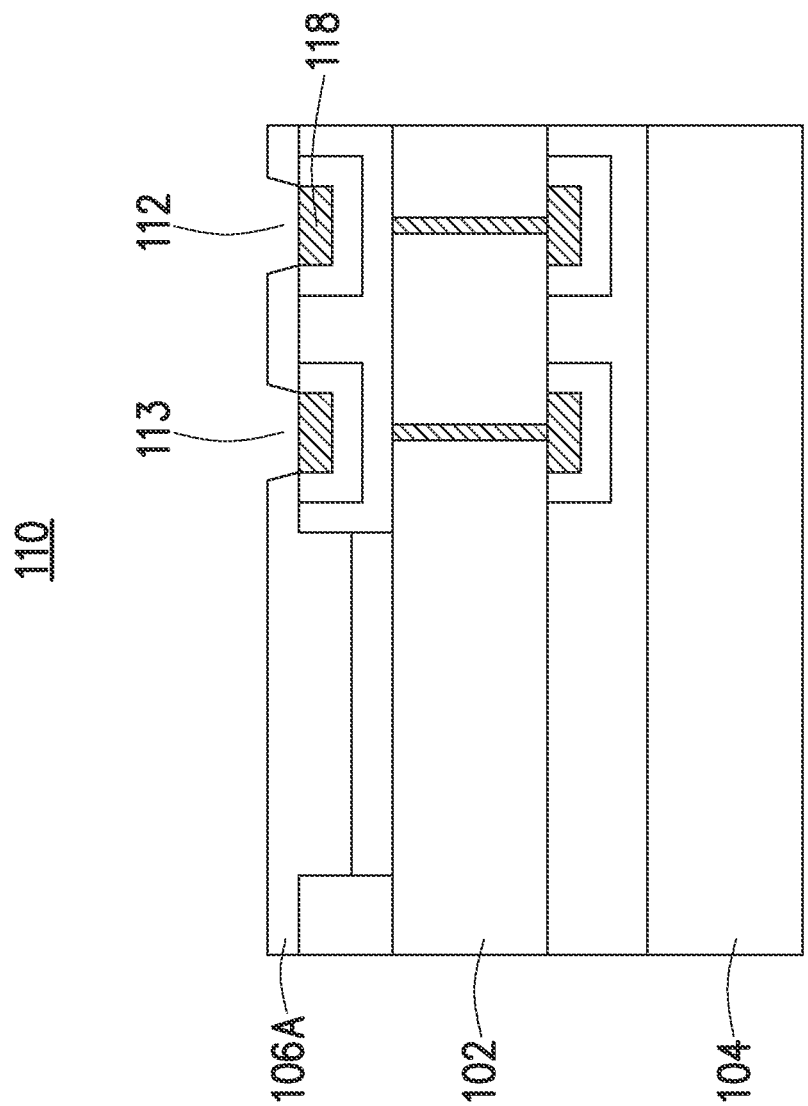
FIG. 1B illustrates the SiPh structure of FIG. 1A with openings in the cladding layer for a first set of vias, in accordance with some embodiments of the present disclosure.

FIG. 1B illustrates a SiPh structure 110 after further processing is performed on the SiPh structure 100 of FIG. 1A to form openings in the first cladding layer 106A to provide a first set of vias 112 and 113, in accordance with some embodiments of the present disclosure. Lithography techniques can be utilized to pattern the openings in the first cladding layer 106A to form the vias 112 and 113, which expose corresponding metal structures 118 formed in the second passivation layer 114B.

Figure 1C:
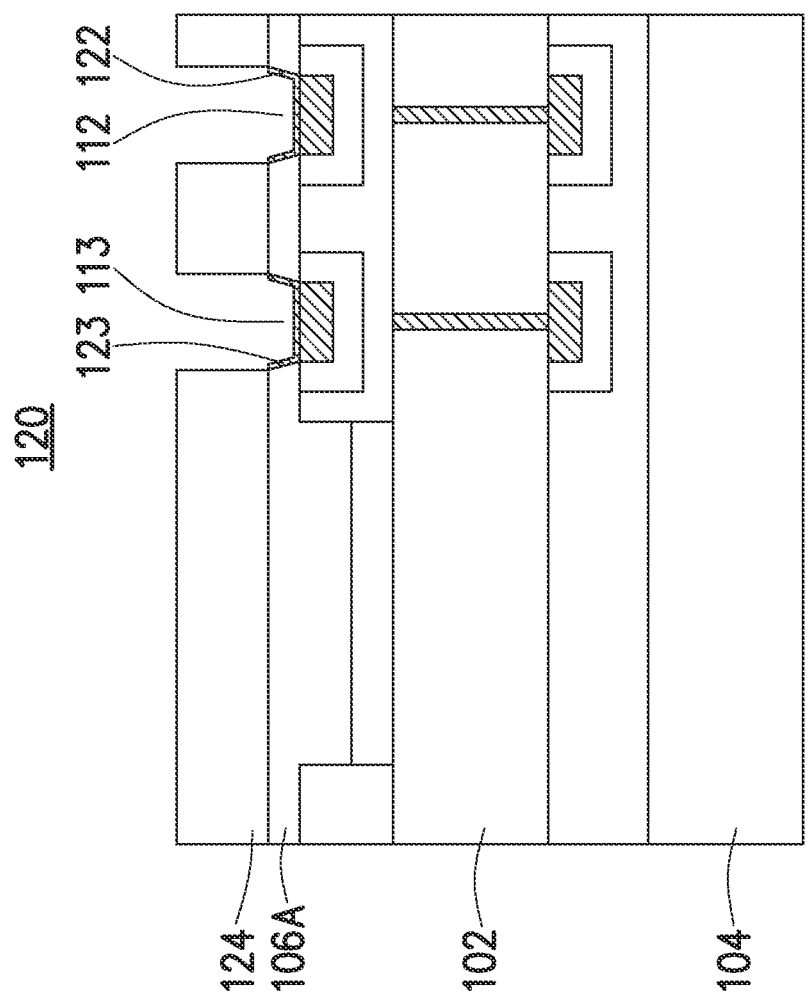
FIG. 1C illustrates the SiPh structure of FIG. 1B with the formation of a thin layer of cooper (Cu) plating in first set of vias of the layer of cladding polymer, in accordance with some embodiments of the present disclosure.

FIG. 1C illustrates a SiPh structure 120 after further processing is performed on the SiPh structure 110 of FIG. 1B to form a thin layer of metal plating 122 and 123 in the openings for the vias 112 and 113, respectively, of the first cladding layer 106A, in accordance with some embodiments of the present disclosure. In some embodiments, the metal plating 122 and 123 include a copper (Cu) metal. As shown in FIG. 1C, the further processing includes forming a first patterned photo resistance (PR) layer 124 on a top surface of the first cladding layer 106A to protect some areas from etching. After etching to expose vias 112 and 113, seed layer sputtering is performed to form the thin metal plating on bottom and side surfaces of vias 112 and 113. In some embodiments, an ashing process is then executed to remove residue of the first PR coating 124 from the etched wafer.

Figure 1D:
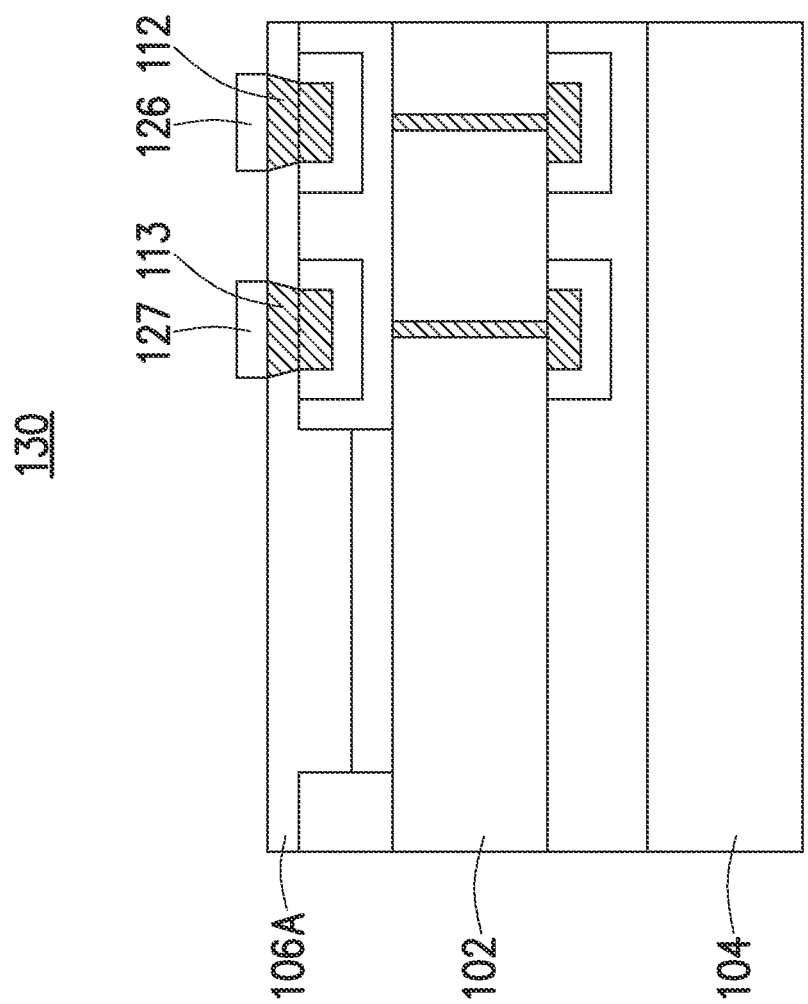
FIG. 1D illustrates the SiPh structure of FIG. 1C with the first set of vias filled with the cooper (Cu) plating in the layer of cladding polymer, in accordance with some embodiments of the present disclosure.

FIG. 1D illustrates a SiPh structure 130 after further processing is performed on the SiPh structure 120 of FIG. 1C to completely fill the vias 112 and 113 with the metal plating material (e.g., Cu) in the first cladding layer 106A, in accordance with some embodiments of the present disclosure. During this further processing, the first PR coating 124 is removed from the first cladding layer 106A, then a second PR coating is re-deposited to form a first PR area 126 and a second PR area 127 above the vias 112 and 113, respectively.

Figure 1E:
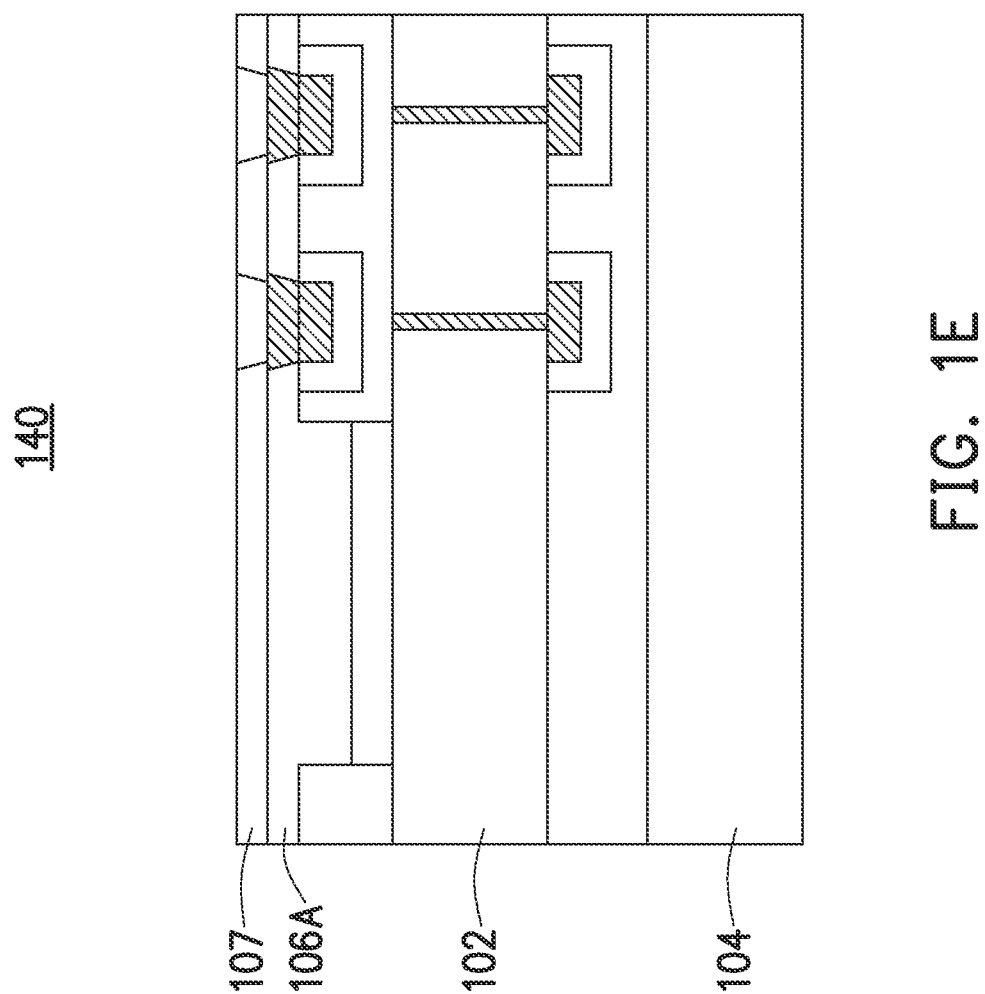
FIG. 1E illustrates the SiPh structure of FIG. 1D with the formation of a core layer disposed on top of the cladding layer, in accordance with some embodiments of the present disclosure.
Figure 1F:
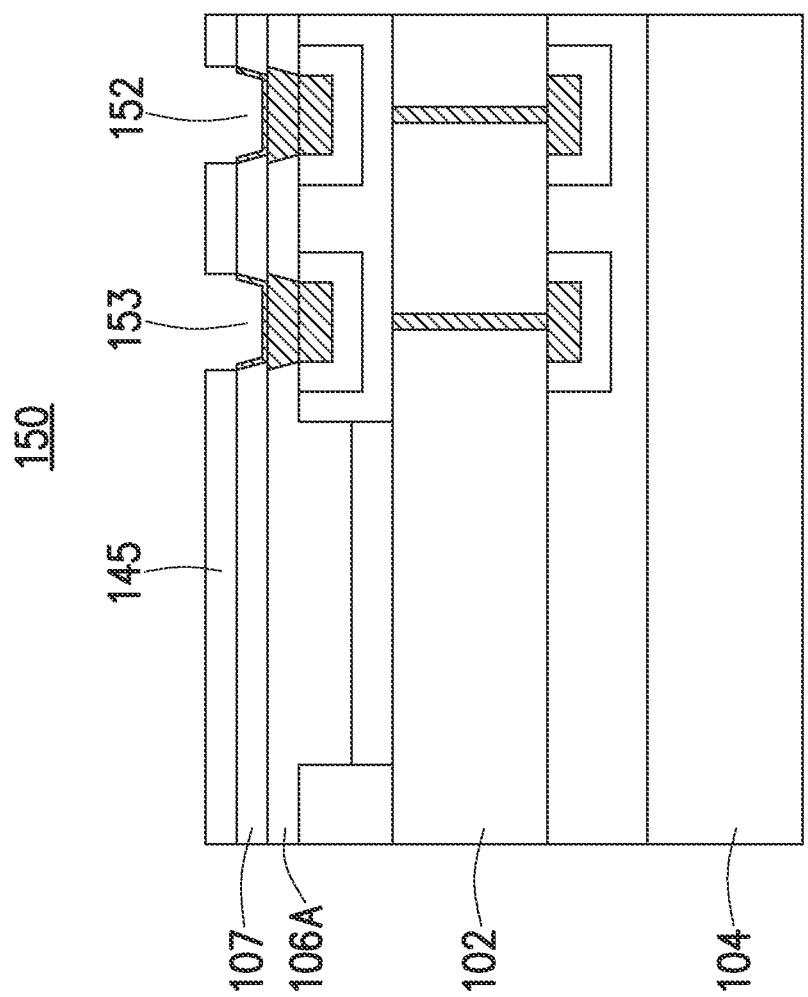
FIG. 1F illustrates the SiPh structure of FIG. 1E with the formation of a second set of vias in the core layer, and the formation of a thin layer of Cu plating in the openings of the second set of vias in the core layer, in accordance with some embodiments of the present disclosure.

FIG. 1E illustrates a SiPh structure 140 after further processing is performed on the SiPh structure 130 of FIG. 1D to form a core layer 107 disposed on top of the first cladding layer 106A, in accordance with some embodiments of the present disclosure. As described in further detail below, the core layer 107 provides a polymer waveguide's core layer, in accordance with some embodiments. To support the design of the waveguide, the refractive index of the first cladding layer 106A is lower than the refractive index of the core layer 107. Polymers can be selected for the first cladding layer 106A and the core layer 107 in order to achieve the desired refractive index relationships. With the re-depositing of the second PR coating above the vias 112 and 113, contact between the core layer 107 and the vias 112 and 113 is reduced or minimized. In some embodiments, the core polymer and/or the cladding polymer can be modified to change their respective refractive indexes. In some embodiments, the refractive index of each polymer can be modified by doping with metal and/or halogen ions, or by changing the curing profile of the polymer (e.g., time, temperature, etc.). FIG. 1F illustrates a SiPh structure 150 after further processing is performed on the SiPh structure 140 of FIG. 1E to form a second set of vias 152 and 153 in the core layer 107, and the formation of a thin layer of metal plating 142 and 143 in each of the openings of the second set of vias 152 and 153, respectively, in accordance with some embodiments of the present disclosure. The process includes: (1) a third PR coating 145 is deposited on top of the core layer 107, (2) the PR coating 145 above the second set of vias is etched, then (3) seed layer sputtering is executed to apply the thin layer of metal 142 and 143 in the openings of the second set of vias 152 and 153.

Figure 1G:
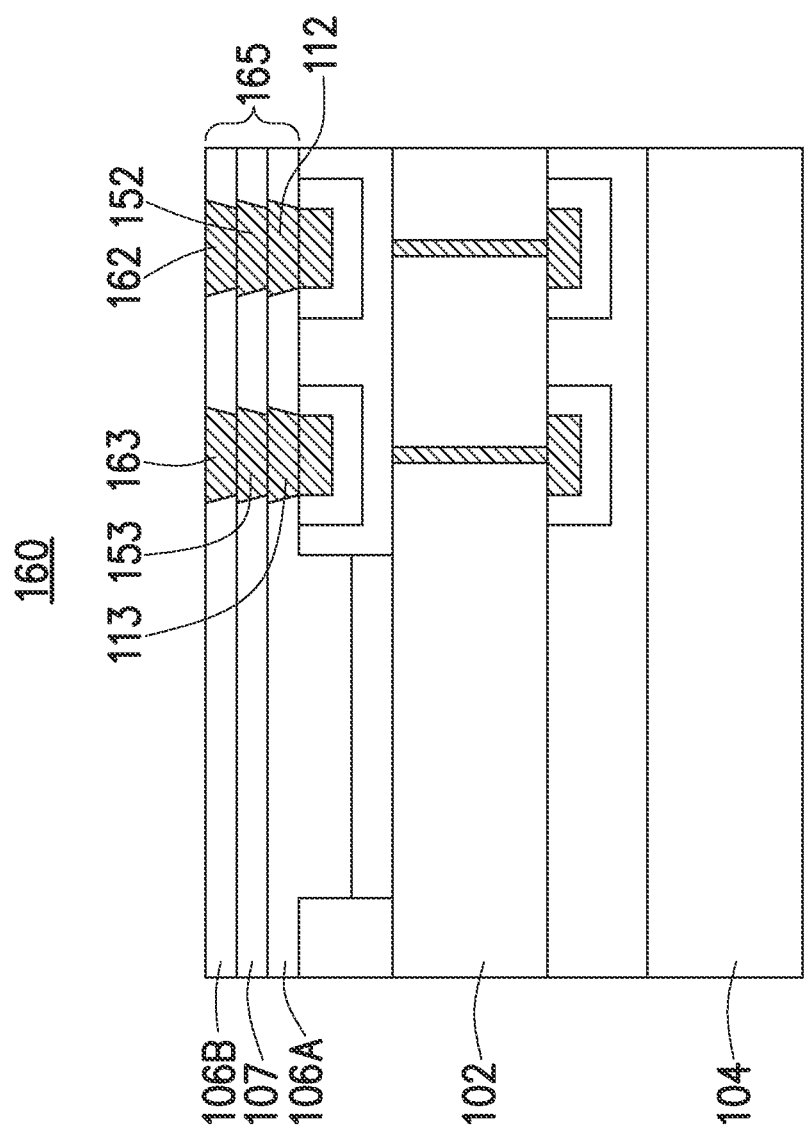
FIG. 1G illustrates the SiPh structure of FIG. 1F with repeating of the steps of FIGS. 1A-1D to form a polymer waveguide (PWG), in accordance with some embodiments of the present disclosure.

FIG. 1G illustrates the SiPh structure 160 after further processing is performed on the SiPh structure 150 of FIG. 1F by repeating of the steps of FIGS. 1A-1D, as discussed above, to form a polymer waveguide (PWG) 165, in accordance with some embodiments of the present disclosure. As shown in FIG. 1G, a second cladding layer 106B and another set of vias 162 and 163 can be formed in the same manner the first cladding layer 106A and vias 112 and 113 are formed, as described above with respect to FIGS. 1A-1D. In this way, the PWG 165 is formed by the core layer 107 and first and second cladding layers 106A and 106B, respectively, such that the cladding layers 106A and 106B border (or surround) the core layer 107. Hereafter, the first and second cladding layers 106A and 106B can be referred to collectively as the cladding layer 106. Since the refractive index is smaller in the cladding layer 106 than the core layer 107, a light signal transmits inside core layer 107 while being guided by the cladding layer 106. As shown in FIG. 1G, the PWG 165 multiple metal-filled vias, 112, 152, 162, 113, 153, 163 that provide electrical connectivity for electrical signals. Effectively, vias 112, 152, 162, 113, 153, 163 provide through-PWG vias formed between PWG layers to provide inter-layer electrical connections.

In some embodiments, the PGW 165 can be designed based on a refractive index range of 1.3 to 2.0, and a thickness (or width) of 2 to 10 um for both cladding layers 106 and core layers 107. In some embodiments, the core layer 107 can be a ladder shape in order to support multi-mode signal transmission. As discussed above, the above-described process steps form the PWG 165 and a plurality of vias that provide electrical connectivity through the PWG 165.

Figure 1H:
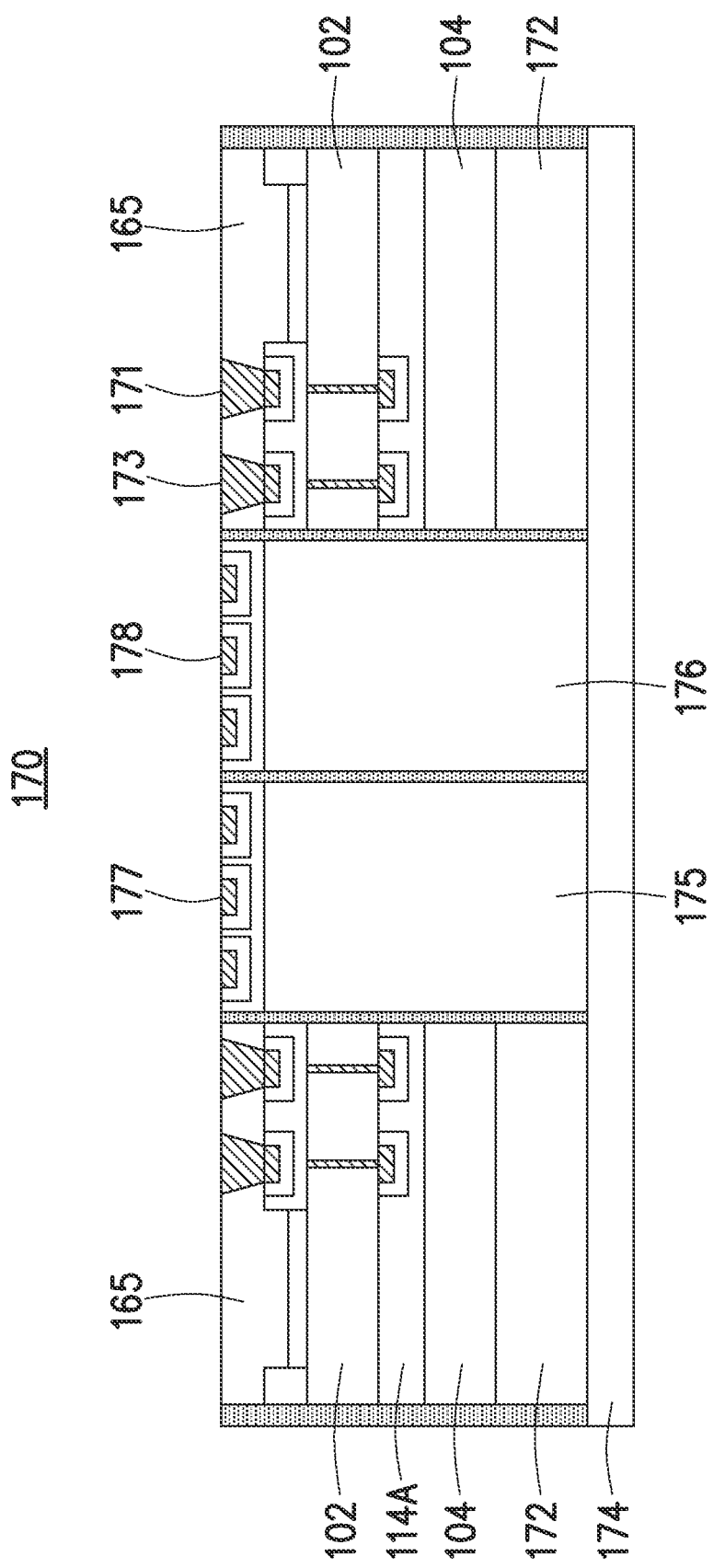
FIG. 1H illustrates the SiPh structure per FIG. 1G with the integration of two ASICs and die bonded to a glass carrier, in accordance with some embodiments of the present disclosure.

FIG. 1H illustrates a SiPh structure 170 after further processing is performed on the SiPh structure 160 of FIG. 1G to integrate two ASICs 175 and 176, die bonded to a glass carrier 174, in accordance with some embodiments of the present disclosure. PIC 102 and EIC 104 are attached together through hybrid bond technology to minimize the thickness of the attached ASIC dies in order to improve the yield of the SiPh structure 170. However, the thickness of the attached ASIC die can impact the yield at a wafer level. In some embodiments, there is a process for InFO or CoWoS packages called "pick-and-place", where a machine picks up dies and puts them on a carrier, then starts the RDL forming, molding, etc. processes. If the dies are too thin, then the dies can break during the pick-and-place process, so thicker dies can improve the package level yield. Additionally, in some embodiments, there can be a thermal consideration that can impact the die yield based on the thickness of the attached ASIC. Effectively, the attached ASIC is a core calculation block of the package. The core calculation block can be always on with a heavy duty status that generates a substantial amount of heat. With thicker silicon, the die can act as a localized "heat sink" for the device layer and can positively impact the yields. In some embodiments, a supportive filling 172 can be added at the backside of EIC 104. In some embodiments, the supportive filling 172 can act as a heat spreader structure to deplete thermal energy from EIC 104. The supportive filling 172 can be Si or $Si_3N_4$ or $SiO_2$, in accordance with various embodiments. In some embodiments, the supportive filling is made from a translucent material so that light signals can be transmitted through the supportive filling 172. In some embodiments, a molding/MCG plastic can provide support for PWG 165 formation.

As shown in FIG. 1H, a plurality (e.g., six) metal structures 177 and 178 are disposed on the top of ASICs 175 and 176, respectively. The SiPh structure 170 also includes vias 171 and 173 formed in the PWG 165. In some embodiments, the via 171 is formed by vias 112, 152 and 162, as described above, and via 173 is formed by vias 113, 153 and 163, as described above. There are two other corresponding sets of PWG vias and TSVs on the left side of FIG. 1H, which can be formed in the same manner as corresponding structures described above. The aforementioned process steps install ASIC 175 and ASIC 176 in SiPh structure 170 and bond SiPh structure 170 to a glass carrier 174. In some embodiments, an additional PWG can be formed on top of the PWG 165.

Figure 2A:
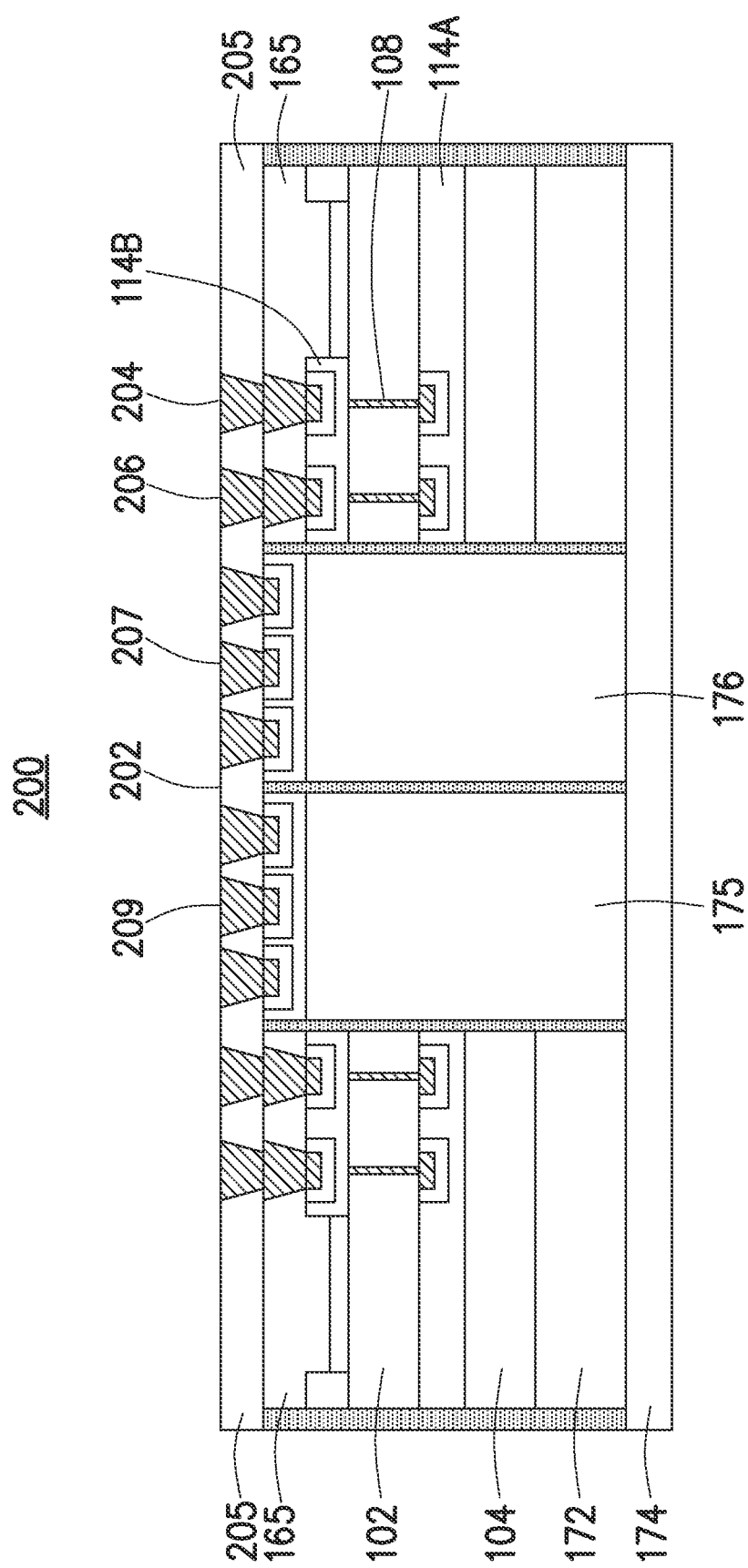
FIG. 2A illustrates the SiPH structure per FIG. 1H with the formation of a PWG bridging layer, in accordance with some embodiments of the present disclosure.

FIG. 2A illustrates a SiPh structure 200 after further processing steps are performed on the SiPh structure 170 of FIG. 1H to form a PWG bridging layer 202, in accordance with some embodiments of the present disclosure. Per FIG. 2A, the PWG bridging layer 202 is formed with a second PWG 205 disposed on top of the first PWG 165. Per FIG. 2A, PWG 165 and PWG 205 have several vias. For example, vias 204 and 206 can provide electrical connections from the top of PWG bridging layer 202 to the second passivation layer 114B, then to TSV 108, then to the first passivation layer 114A, and then to EIC 104. The vias located on top of ASIC 175 and ASIC 176, for example, vias 207 and 209, electrically connect ASIC 175 and ASIC 176 to other contact structures (not shown). Collectively, the PWG 165 and PWG 205 with their respective vias form a PWG bridging layer 202.

Figure 2B:
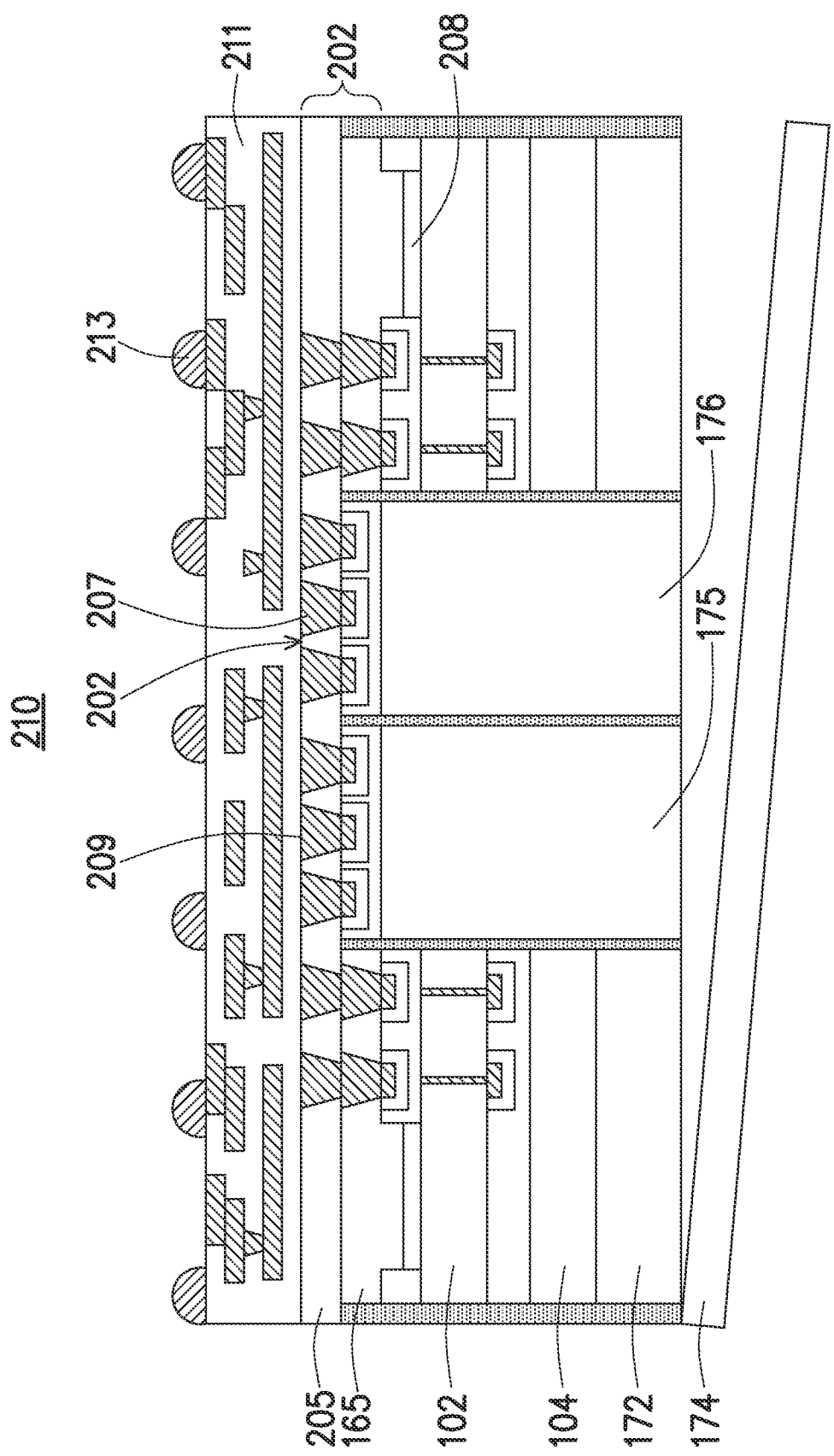
FIG. 2B illustrates the SiPh structure per FIG. 2A with the formation of an integration fan-out redistribution layer (InFO RDL) disposed on top of the PWG bridging layer, in accordance with some embodiments of the present disclosure.

FIG. 2B illustrates a SiPh structure 210 after further processing is performed on the SiPh structure 200 of FIG. 2A to form an integration fan-out redistribution layer (InFO RDL) 211 disposed on top of the PWG bridging layer 202, in accordance with some embodiments of the present disclosure. InFO RDL 211 comprises the same polymer as the cladding layer 106. InFO RDL layers support electrical signals and can be used to connect to the two ASICs 175 and 176, or connect an electrical signal passing through a via. Fabricated on top of InFO RDL 211 are a plurality of conductive bumps 213 that provide electrical connections between the SiPh structure 210 and other conductive structures, e.g., conductive bumps, pads or lines of other dies, circuits, etc. (not shown). The InFO RDL 211 provides electrical connections for ASICs 175 and 176 through the vias on top of PWG bridging layer 202, such as vias 207 and 209. In some embodiments, after the InFO RDL 211 is formed, the glass carrier 174 is debonded from the bottom of the ASICs 175 and 176 and the filler 172. Thus, the SiPh structure 210 provides coupling for PIC 102, EIC 104, ASIC 175 and ASIC 176 to allow for interconnections among these components. After completion of the aforementioned process steps, SiPh structure 210 represents an exemplary embodiment of a photonic/electric IC package by using polymer waveguides.

FIG. 2B also indicates the location of edge coupler 208 disposed within edge coupler 111 that can provide an interface between a polymer waveguide and a silicon waveguide. Edge coupling will be further discussed relative to FIG. 2C. As previously noted, PWG bridging layer 202 comprises PWG 165 and PWG 205. Within PWG bridging layer 202, inter-layer coupling can be provided, as will be discussed relative to FIGS. 2E, 2F, 2G and 2H.

Figure 2C:
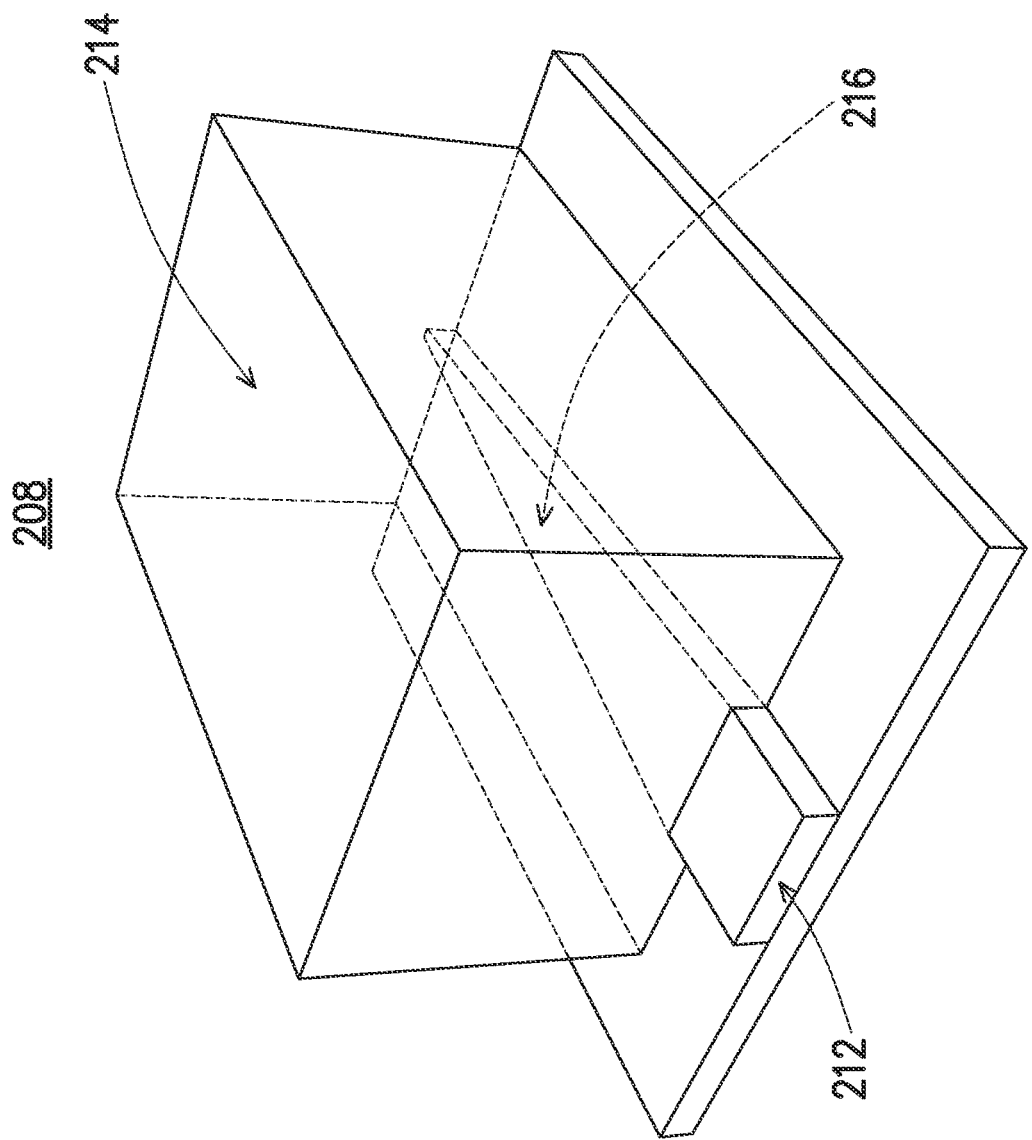
FIGS. 2C-2D illustrates embodiments of edge coupling, in accordance with some embodiments of the present disclosure.

FIG. 2C illustrates the edge coupler 208, in accordance with some embodiments of the present disclosure. Per FIG. 2B, the location of edge coupler 208 in SiPh structure 210 was noted. Per FIG. 2C, edge coupler 208 provides a coupling between a silicon waveguide 212 and PWG 214, which can be the PWG 165 discussed above. Silicon waveguide 212, with taper 216, projects into PWG 214. With the pointed shape of the silicon waveguide 212, light can be "squeezed" into the PWG 214. Hence, with edge coupler 208, light can be transferred from a silicon waveguide 212 to the PWG 214. Edge coupler 208 has the same functionality as edge coupler 111.

Figure 2D:
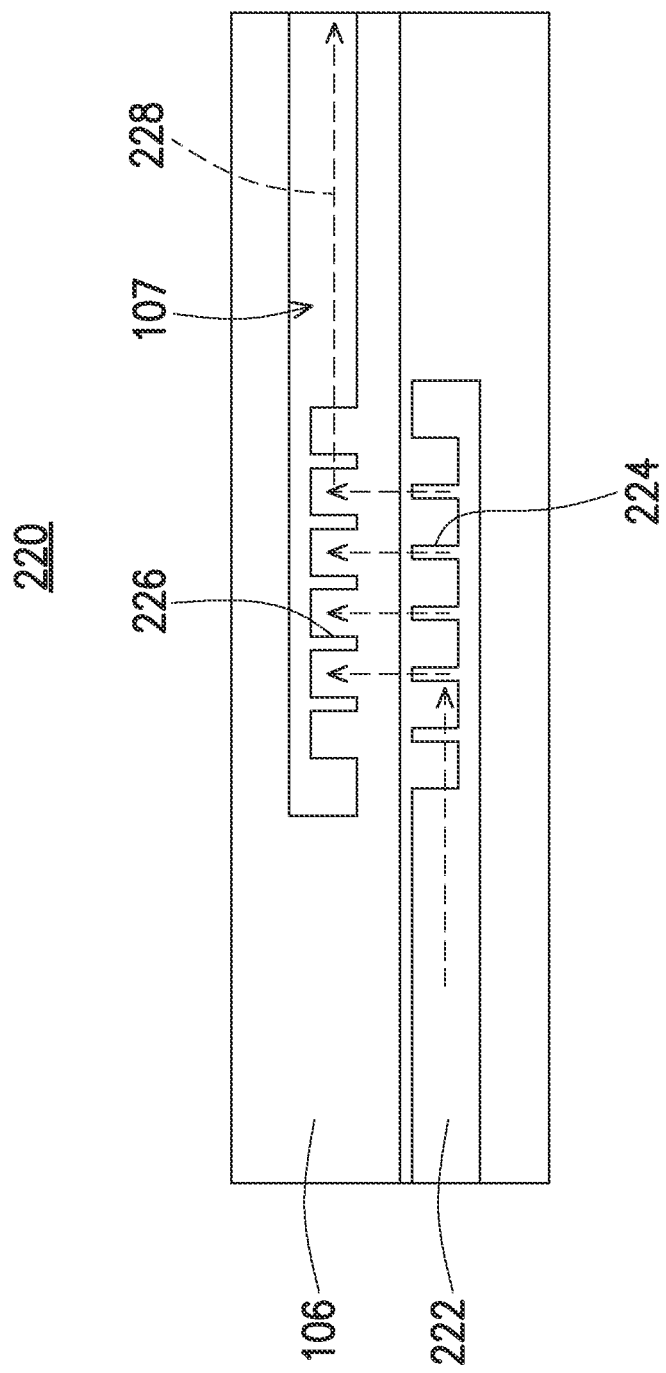

FIG. 2D illustrates an embodiment of a grating coupler 220, in accordance with alternative embodiments of the present disclosure. Grating coupler 220 couples a light signal from silicon waveguide 222 to the core layer 107, i.e., a polymer waveguide. Core layer 107 is surrounded by cladding layer 106. Grating coupler 220 includes upper and lower grating structures 226 and 224, respectively, where the direction of the light is changed by the lower grating structure 224 in silicon waveguide 222 and the light is collected by the upper grating structure 226 in the core layer 107. The direction of light is illustrated in FIG. 2D by the dotted lines 228. In some embodiments, grating coupler 220 is fabricated with a combination of silicon and polymer materials.

In comparing edge coupler 208 to grating coupler 220, grating coupler 220 requires less space but has a higher signal loss than edge coupler 208. Accordingly, edge coupling can be preferred if higher performance, with a lower signal loss is important and the design supports the space requirements. The design and selection can be determined by the wavelength of the light signal. For some embodiments, the wavelength can be 800 nm, 1310 nm or 1510 nm.

FIGS. 2E, 2F, 2G and 2H illustrate embodiments of inter-layer coupling within a polymer waveguide, in accordance with some embodiments of the present disclosure. Embodiments previously described herein support one layer for optical signal transmission. With inter-layer coupling, optical signals can be transferred or coupled between several polymer layers.

Figure 2E:
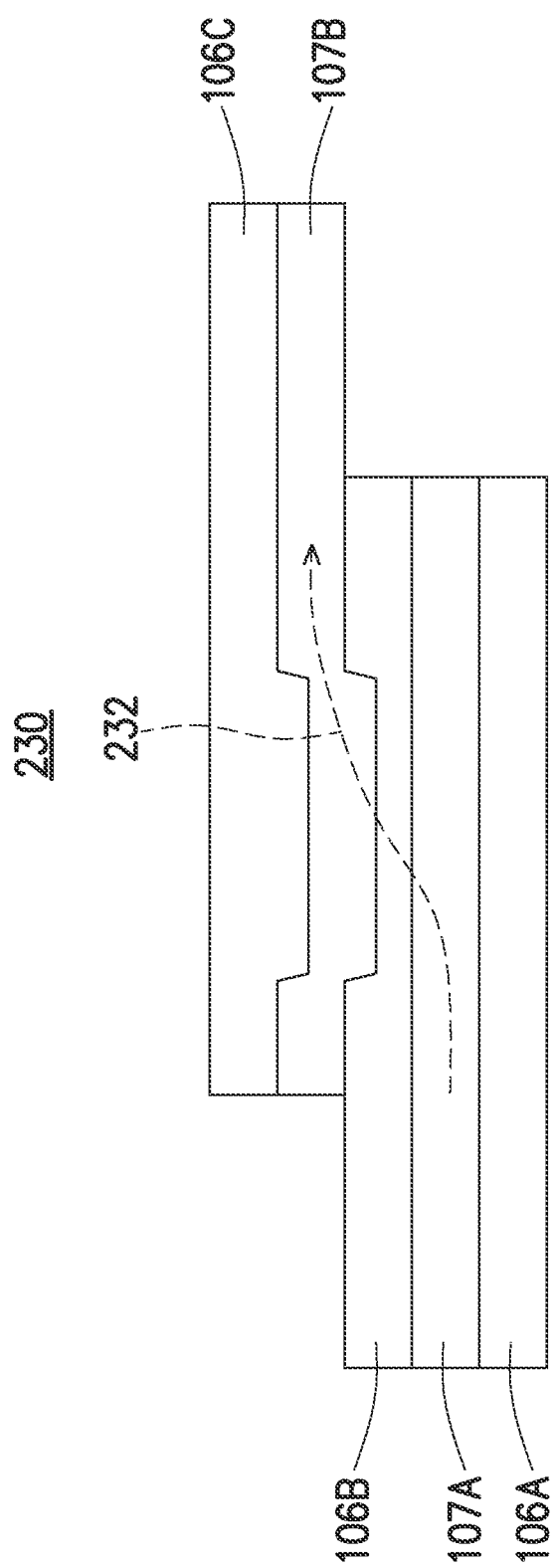
FIGS. 2E, 2F, 2G and 2H illustrate embodiments of inter-layer coupling, in accordance with some embodiments of the present disclosure.

FIG. 2E illustrates inter-layer coupling 230 between a plurality of cladding layers 106A, 106B, 106C and a plurality of core layers 107A and 107B. Polymer layers can form some concave/bump topology on their surface to facilitate a transfer of the light signal 232 from one PWG layer to another PWG layer. As shown in FIG. 2E, a light signal 232 propagates through core layer 107A and is coupled through a relatively thin portion of the cladding layer 106B to core layer 107B. As further shown in FIG. 2E, the core layer 107B bends and protrudes downwardly toward the core layer 107A at the relatively thin portion of the cladding layer 106B that is thinner than other portions of the cladding layer 106B. Cladding layer 106A and cladding layer 106C complete the structure of the polymer waveguide, as shown in FIG. 2E.

Figure 2F:
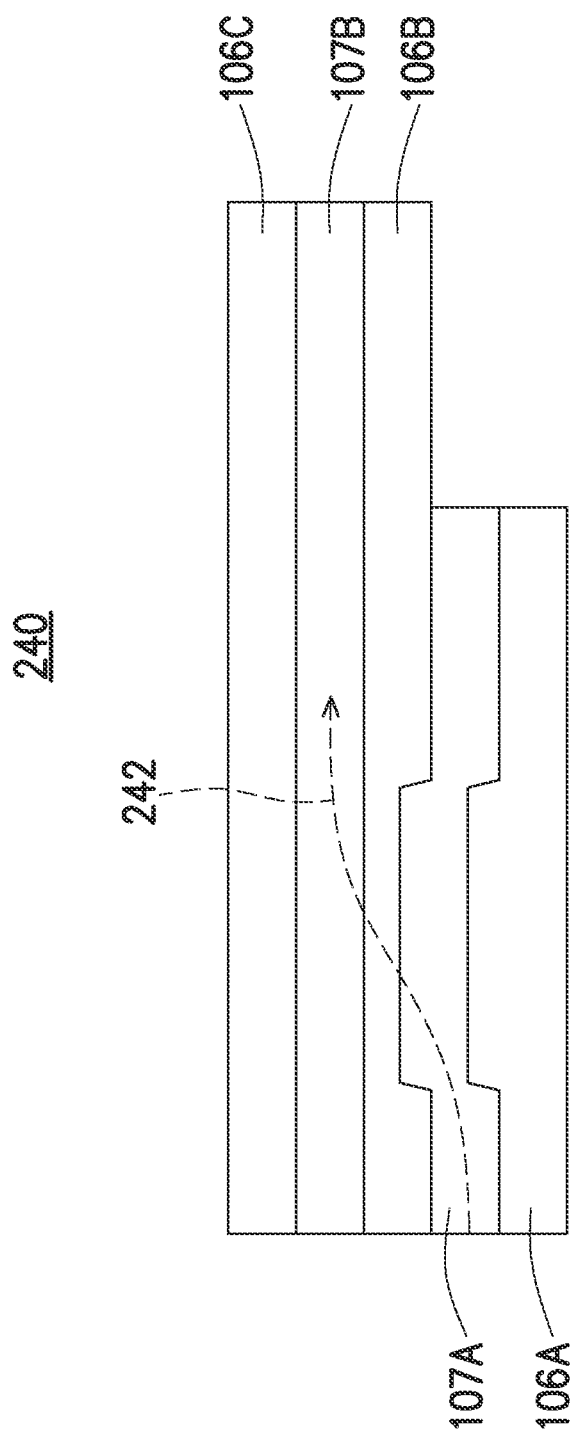

FIG. 2F illustrates a similar embodiment of inter-layer coupling 240 between a plurality of cladding layers 106A, 106B and 106C, and a plurality of core layers 107A and 107B. Polymer layers can form some concave/bump topology on the surface to facilitate a transfer the light signal 242 from one PWG layer to another PWG layer. FIG. 2F illustrates different shape patterns of the cladding layer and the core layer of the polymer waveguide as compared with FIG. 2E. The direction of light signal 242 adjusts to the shape patterns in the polymer waveguides. For FIG. 2F, light signal 242 propagates through core layer 107A and is coupled through a relatively thin portion of cladding layer 106B to core layer 107B. In this embodiment, a portion of the core layer 107A bends and protrudes upwardly toward the core layer 107B at the relatively thin portion of the cladding layer 106B. Cladding layer 106A and cladding layer 106C complete the structure of the polymer waveguide.

Figure 2G:
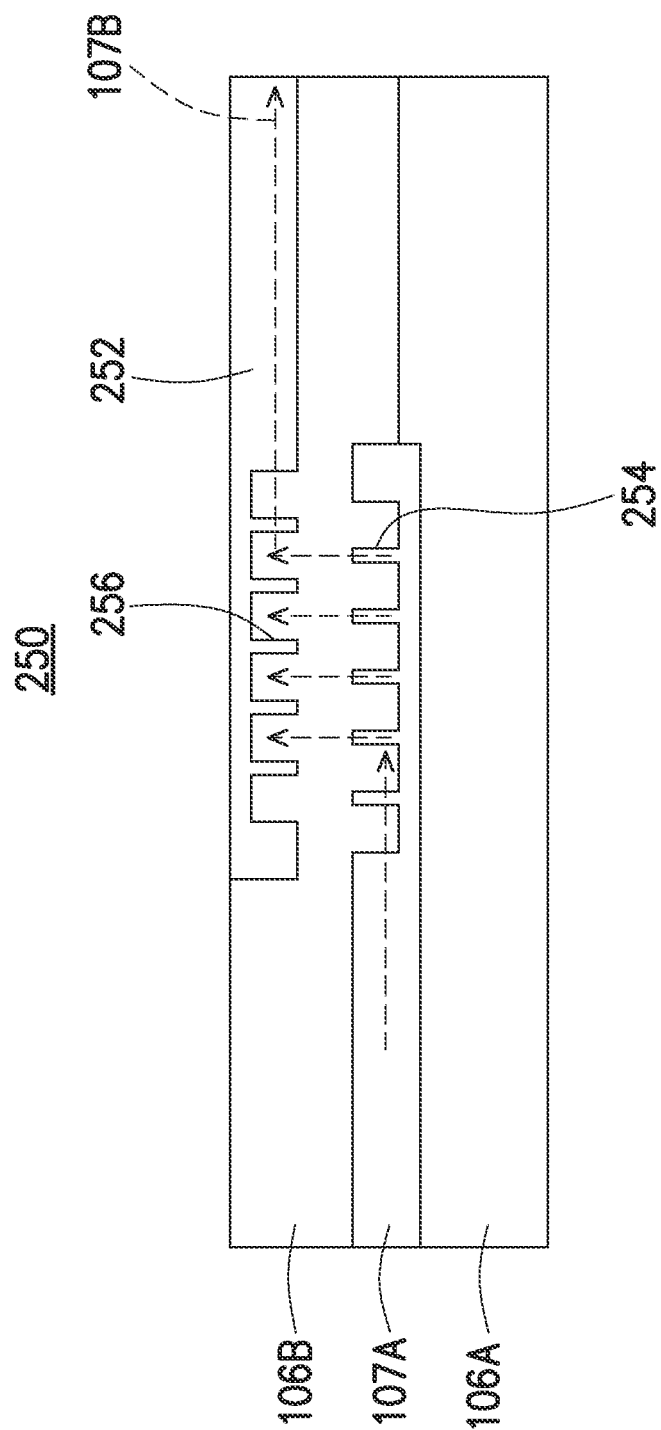

FIG. 2G illustrates a grating coupler 250 for inter-layer coupling within a polymer waveguide, in accordance with some embodiments of the present disclosure. As illustrated, light signal 252 propagates through core layer 107A to the lower grating structure 254 associated with core layer 107A. Then, the direction of light signal 252 changes and is directed through the cladding layer 106B to the upper grating structure 256 in core layer 107B. The upper grating structure 256 in the core layer 107B collects the light signal 252 and changes the direction of light signal 252 to allow the propagation through core layer 107B. In some embodiments, all elements of the grating coupler 250 are made of a polymer, either a cladding polymer or a core polymer. In comparison, grating-coupler 220 of FIG. 2D is fabricated with a combination of silicon and polymer, in accordance with some embodiments.

Figure 2H:
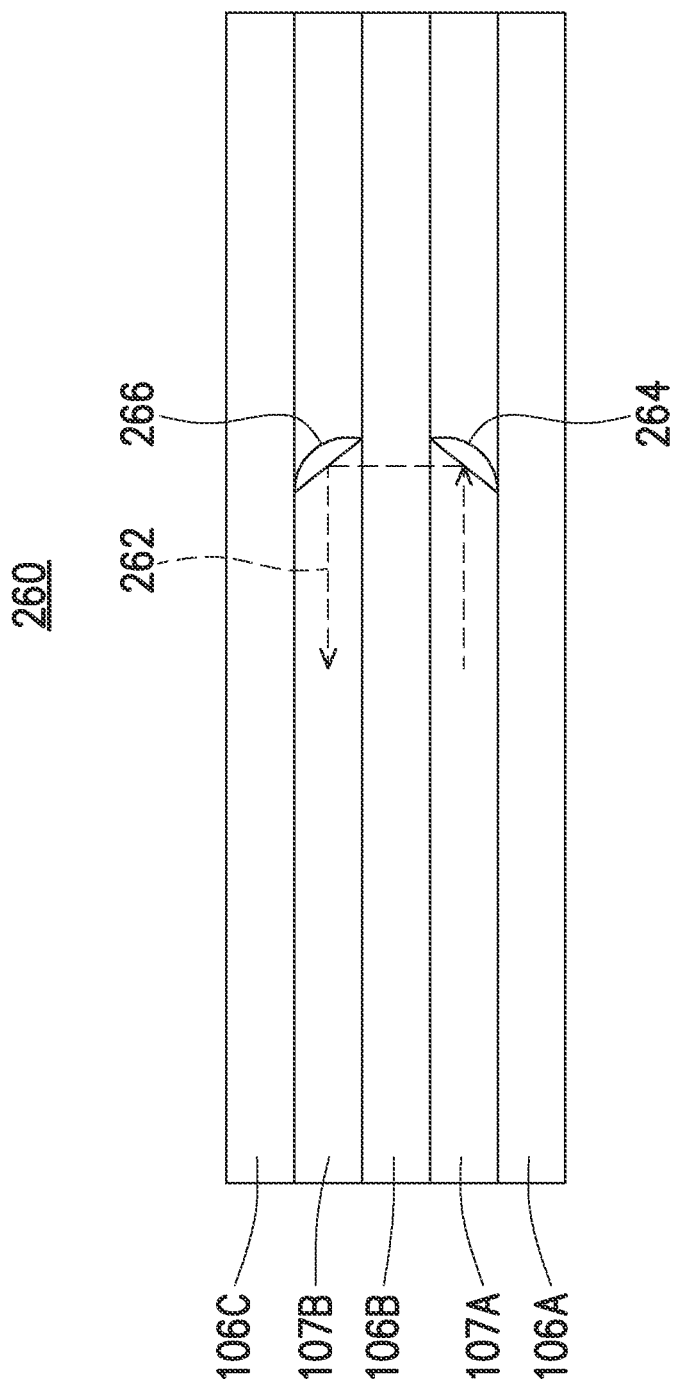
Figure 21:
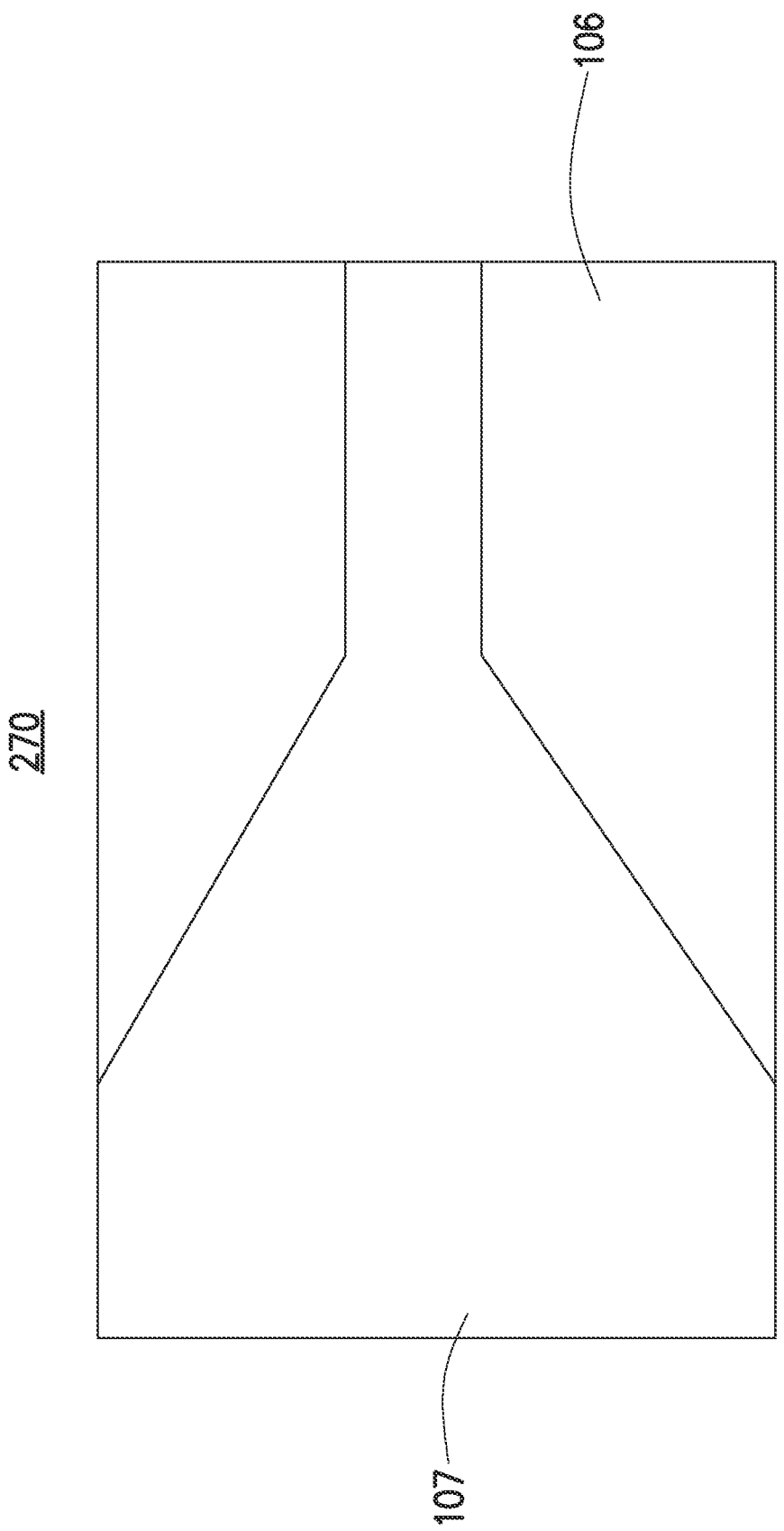

FIG. 2H illustrates inter-layer coupling structure 260 within a polymer waveguide with reflective prisms. Reflective prism can be formed by locally changing the refractive index in the PWG to reflect the light in a direction from one layer to another layer. Refractive index can be modified by various methods. For example, a modification can be a change in a metal or Cu doping inside the polymer or there can be a change in the fabrication process. In summary, reflective prisms, formed by changing the refractive index in at least one of the layers of the cladding layer and core layer, allow a reflection of a light signal from one PWG layer to another PWG layer.

As illustrated in FIG. 2H, a light signal 262 propagates down core layer 107A and is reflected by a first prism 264. The light signal 262 then propagates through cladding layer 106B to core layer 107B, where the light signal 262 is reflected by a second prism 264. The light signal 262 is then directed to propagate down core layer 107B. Other cladding layers in FIG. 2H include cladding layer 106A and cladding layers 106C.

FIG. 2I illustrates a reflective prism 270, in accordance with some embodiments of the present disclosure. Reflective prism 270 comprises the core layer 107 having a funnel-shape where the cladding layer 106 borders (or surrounds) the funnel-shape of the core layer 107, and the narrow end of the funnel-shaped core layer 107 projects through the cladding material. As shown in FIG. 2I, as the funnel-shaped core layer 107 becomes narrower from a first width to a second width, narrower than the first width, the cladding layer 106 correspondingly becomes thicker. In some alternative embodiments, a reflective prism can be formed with glass without any layers of polymer.

Figure 3A:
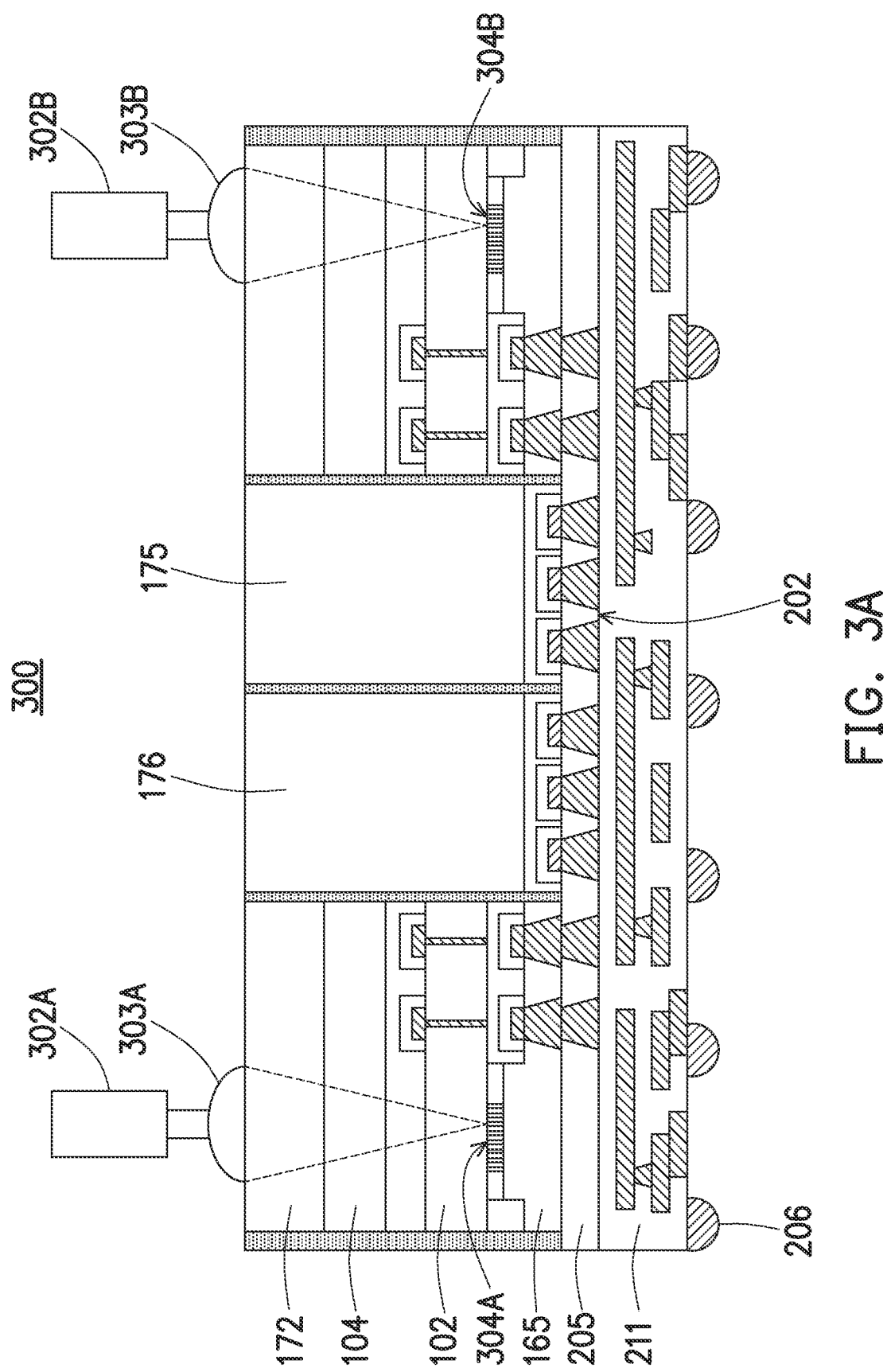
FIG. 3A illustrates the SiPh structure per FIG. 2B with an embodiment of a fiber interface supported by an optical lens and SiPh grating-coupler, in accordance with some embodiments of the present disclosure.
Figure 3B:
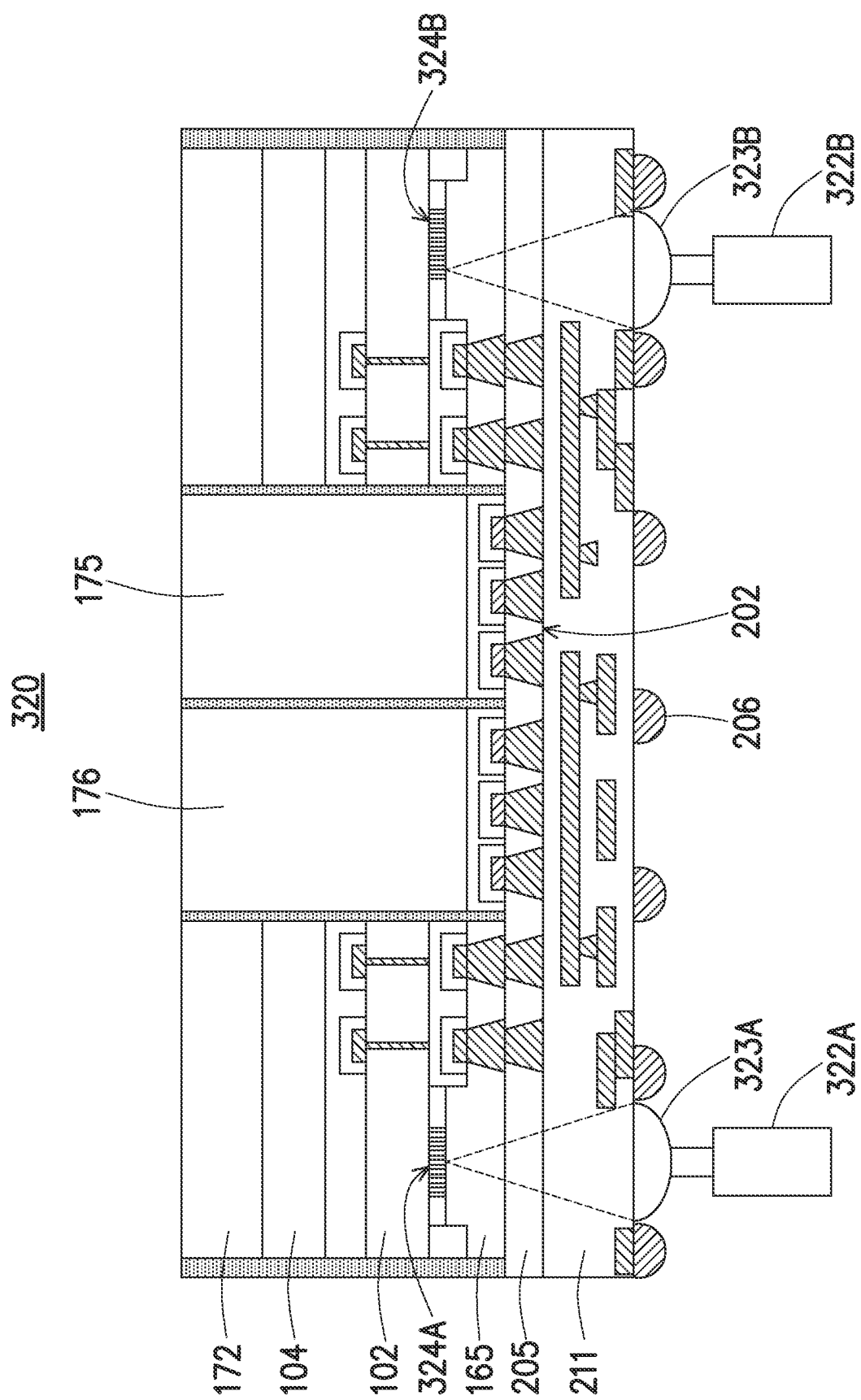
FIG. 3B illustrates the SiPh structure per FIG. 2B with another embodiment of a fiber interface supported by an optical lens and SiPh grating-coupler, in accordance with some embodiments of the present disclosure.
Figure 3C:
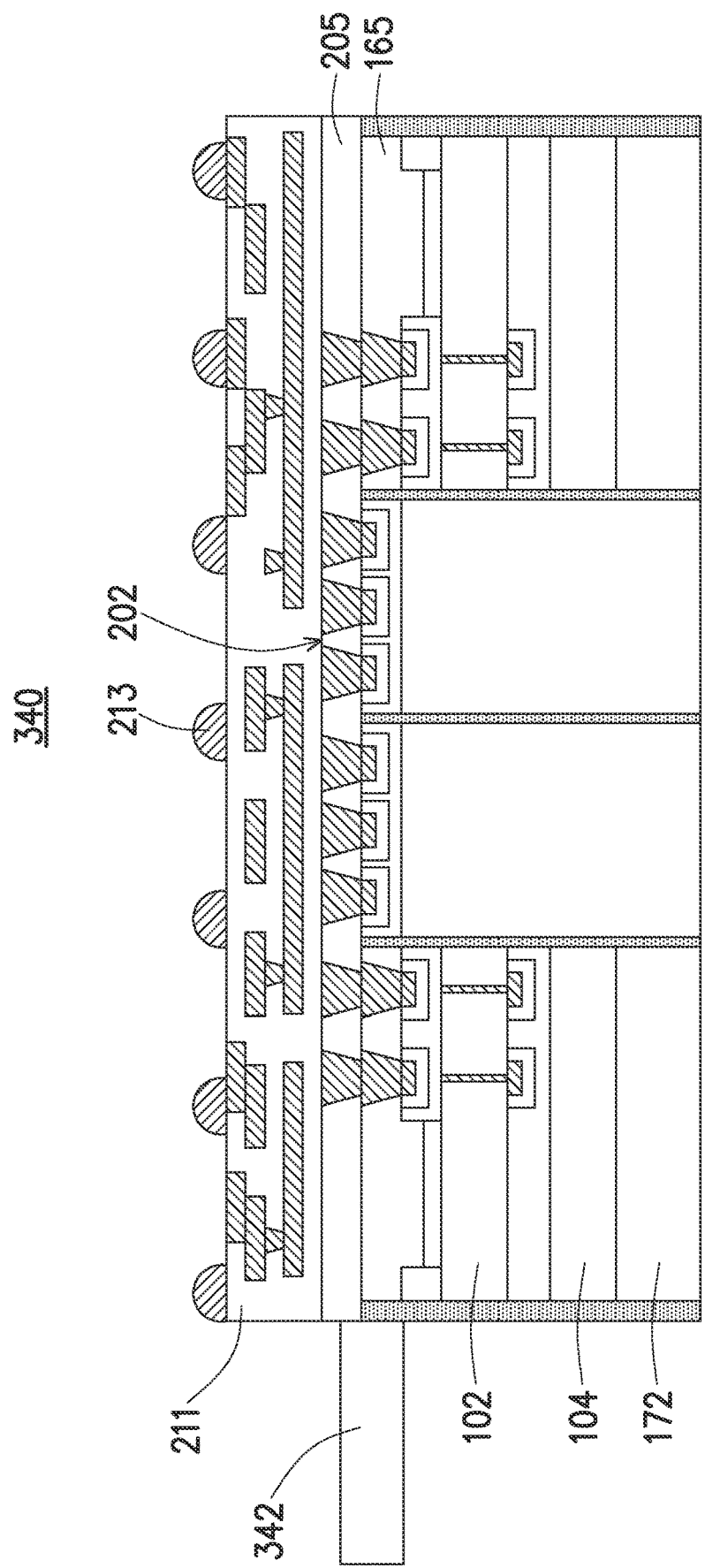
FIG. 3C illustrates the SiPh structure per FIG. 2B with a fiber coupled to PWG bridging layer, in accordance with some embodiments of the present disclosure.

FIGS. 3A, 3B and 3C illustrate three embodiments for a fiber interface to a SiPh package: (1) FIG. 3A—light propagates through fillings within the SiPh package; (2) FIG. 3B—light propagates through cladding layers within the PWG bridging layers; and (3) FIG. 3C—a fiber is coupled directly to PWG bridging layers. These embodiment are further discussed in the following paragraphs.

The SiPh structure 300 of FIG. 3A connects an optical package with an external light source, in accordance with some embodiments. SiPh structure 300 is similar to the SiPh structure 210 of FIG. 2B with a fiber interface supported by an optical lens 303A, optical lens 303B, SiPh grating-coupler 304A and SiPh grating-coupler 304B, in accordance with some embodiments of the present disclosure. Light signals are emitted from fiber 302A and fiber 302B and coupled to optical lens 303A, and optical lens 303B, respectively. The light signals are projected from optical lens 303A, and optical lens 303B through several layers of SiPh structure 300 including supportive filling 172, EIC 104, passive layer 114, PIC 102 and are coupled to SiPh grating-coupler 304A and SiPh grating-coupler 304B, respectively. SiPh grating-coupler 304A and SiPh grating-coupler 304B have similar signal functionality as grating-coupler 220, as discussed above relative to FIG. 2D. Optical lens 303A, and optical lens 303B are formed with polymer and/or silicon, in accordance with various embodiments. In summary, optical signals from fibers 302A and 302B are coupled to the optical lenses 303A and 303B, respectively, which directs respective light signals through supportive filling 172, the EIC 104, the PIC 102 and then to the SiPh grating-couplers 304A and 304B, respectively.

The SiPh structure 320 of FIG. 3B connects an optical package with an external light source, in accordance with some embodiments. SiPh structure 320 is similar to the SiPh structure 210 of FIG. 2B but adds a fiber interface supported by optical lens 323A, optical lens 323B, SiPh grating-coupler 324A and SiPh grating-coupler 324B, in accordance with some embodiments of the present disclosure. Light signals are emitted from fiber 322A and fiber 322B and coupled to optical lens 323A, and optical lens 323B, respectively. The light signals are projected from optical lens 323A and optical lens 323B through InFO RDL 211 and PWG bridging layer 202 and coupled to SiPh grating-coupler 304A and SiPh grating-coupler 304B, respectively. SiPh grating-coupler 324A and SiPh grating-coupler 324B have similar functionality as grating-coupler 220, as discussed above relative to FIG. 2D. In summary, a fiber is coupled to each optical lens 323A and 323B, which directs a light signal through the InFO RDL layer 211, through the polymer bridging layer 202 to the SiPh grating couplers 324A and 324B, respectively.

The SiPh structure 340 of FIG. 3C connects an optical package with an external light source, in accordance with some embodiments. SiPh structure 340 is similar to the SiPh structure 210 FIG. 2B with an added fiber 342 coupled to PWG bridging layer 202, in accordance with some embodiments of the present disclosure. Light signals are emitted from fiber 342 and coupled directly to the PWG bridging layer 202 at lateral side portion of the PWG bridging layer 202. From fiber 342 to PWG 165, the light signals can have active alignment. In some embodiments, a machine can track the light intensity to make sure that the core of a fiber and the core of a PWG are optically aligned. From PIC 102 to another chip at the lateral side of the package, the light signal can be coupled from PWG 165 through PWG 205, and from PWG 205 to PWG 165, then coupled to the another chip on the lateral side of the package (e.g., the right side of SiPh structure 340 of FIG. 3C). In some embodiments, the coupling between PWG 165 and PWG 205 can be achieved by the methods disclosed in FIG. 2E, FIG. 2F, FIG. 2G and FIG. 2H.

Figure 4A:
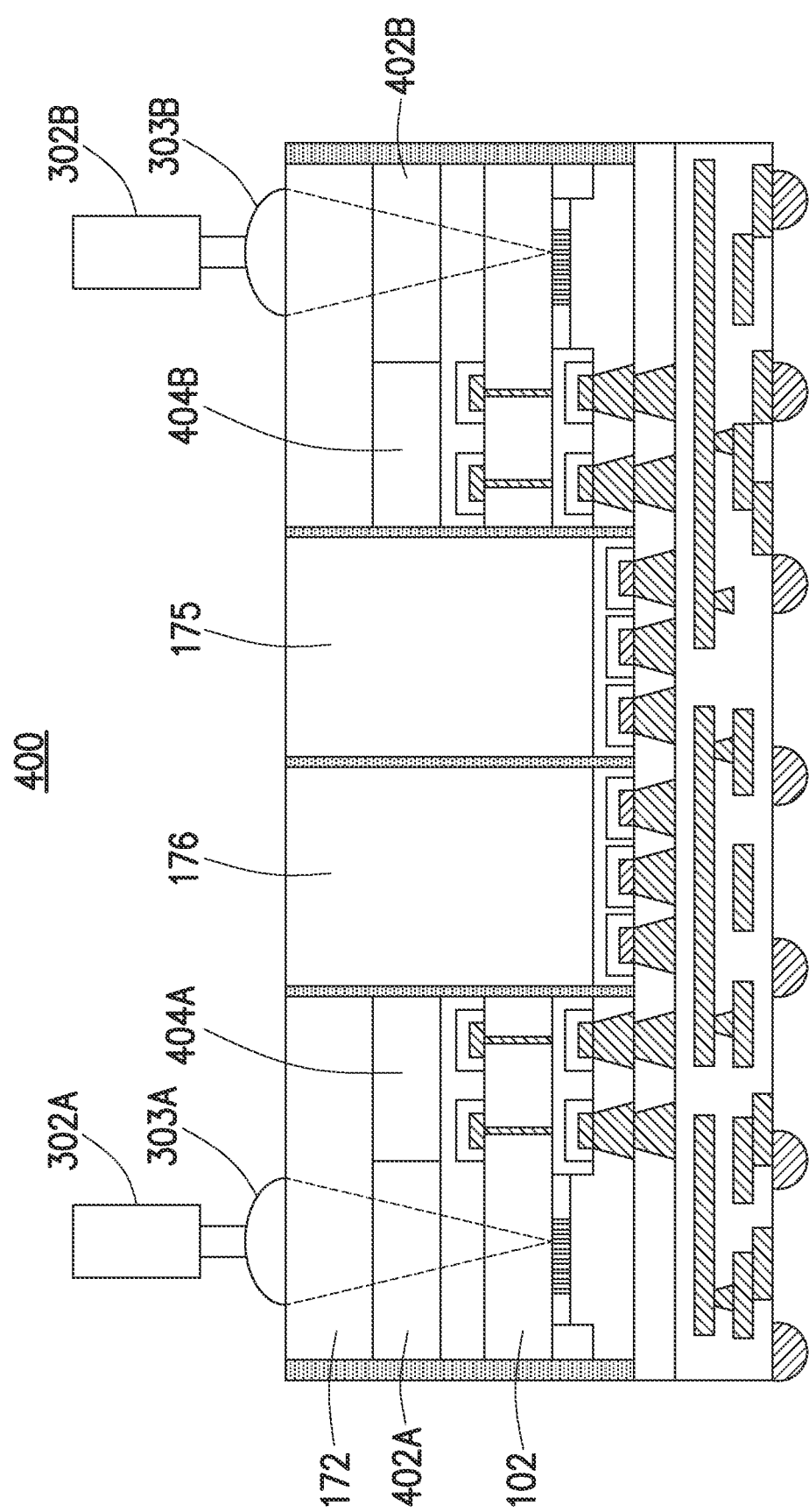
FIG. 4A illustrates the SiPh structure per FIG. 3A with a modification to the electrical integrated circuit, in accordance with some embodiments of the present disclosure.

FIG. 4A illustrates a SiPh structure 400 which is similar to the SiPh structure 300 of FIG. 3A but with a modification to the electrical integrated circuit, in accordance with some embodiments of the present disclosure. The length of EIC 104 of FIG. 3A is reduced, as illustrated by EIC 404A and EIC 404B of FIG. 4A. Accordingly, EIC 404A and EIC 404B can be a smaller size than PIC 102. As illustrated, to fill in the resulting gaps, filling gaps 402A and 402B are disposed adjacent to EIC 404A and EIC 404B, respectively. The length of filling gap 402A and EIC 404A is similar to the length of PIC 102, which is disposed beneath fillings gap 402A and EIC 404A. Dimensions are similar for filling gap 402B and EIC 404B relative to PIC 102 on the opposite side of the ASICs 175 and 176. In some embodiments, filling gaps 402A and 402B can be filled with Si/SiO2/Si3N4 by deposition. In some embodiments, light may penetrate through filling gaps 402A and 402B more efficiently than penetrating through EIC 404A and EIC 404B. An additional benefit is that since silicon is sensitive to temperature, filling gaps 402A 402B can act as a heat sink for EICs or ASICs.

Figure 4B:
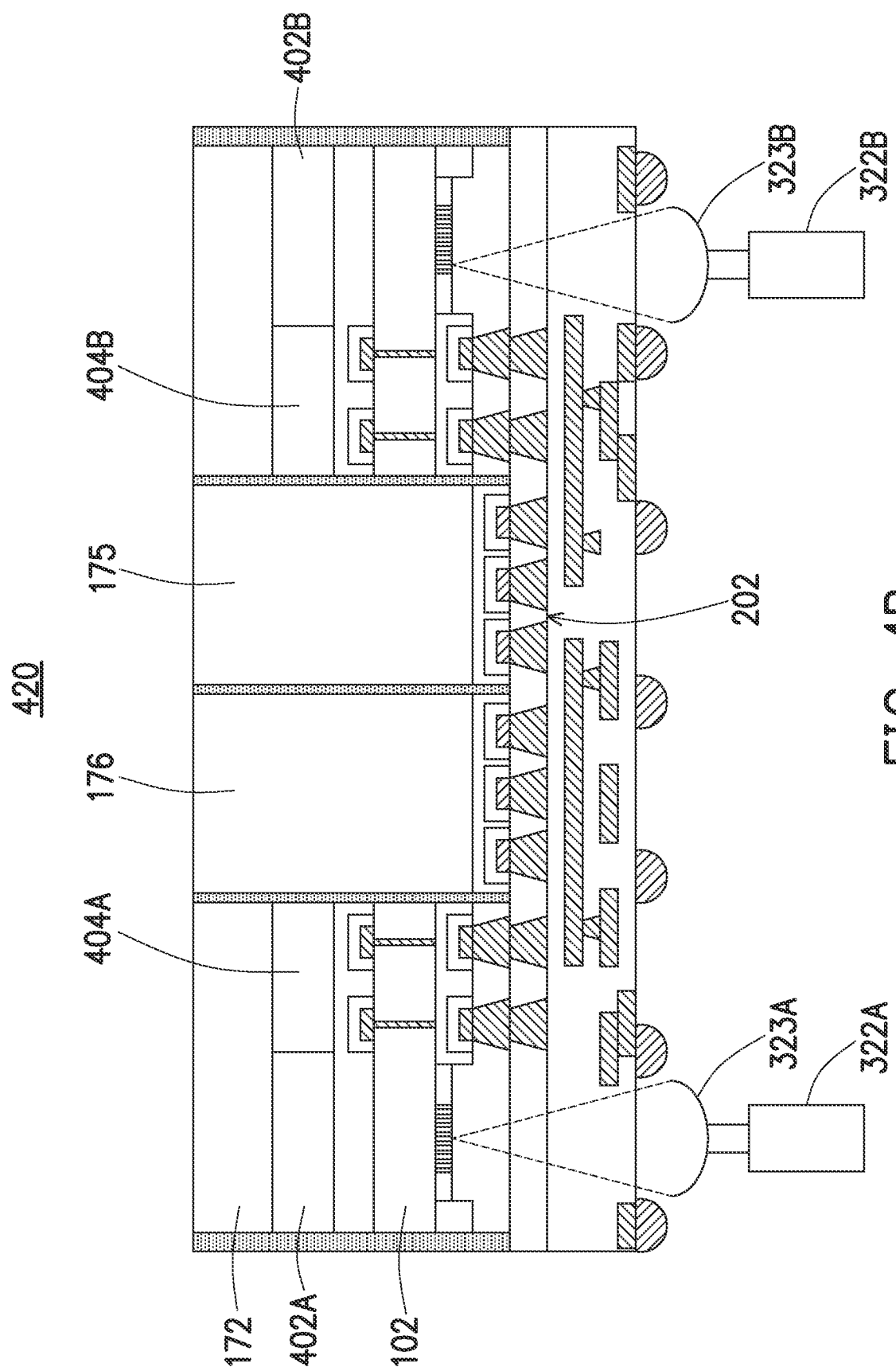
FIG. 4B illustrates the SiPh structure per FIG. 3B with a modification to the electrical integrated circuit, in accordance with some embodiments of the present disclosure.

FIG. 4B illustrates a SiPh structure 420 which is similar to the SiPh structure 320 of FIG. 3B but with a modification to the electrical integrated circuit, in accordance with some embodiments of the present disclosure. The modification is essentially the same as for SiPh structure 400 of FIG. 4A. The length of EIC 104 is reduced, as illustrated by EIC 404A and EIC 404B. Filling gaps 402A and 402B are added adjacent to EIC 404A and EIC 404B, respectively. For this embodiment, the addition of filling gaps 402A and 402B do not impact the light penetration, but are beneficial as a heat sink for EICs or ASICs.

Figure 4C:
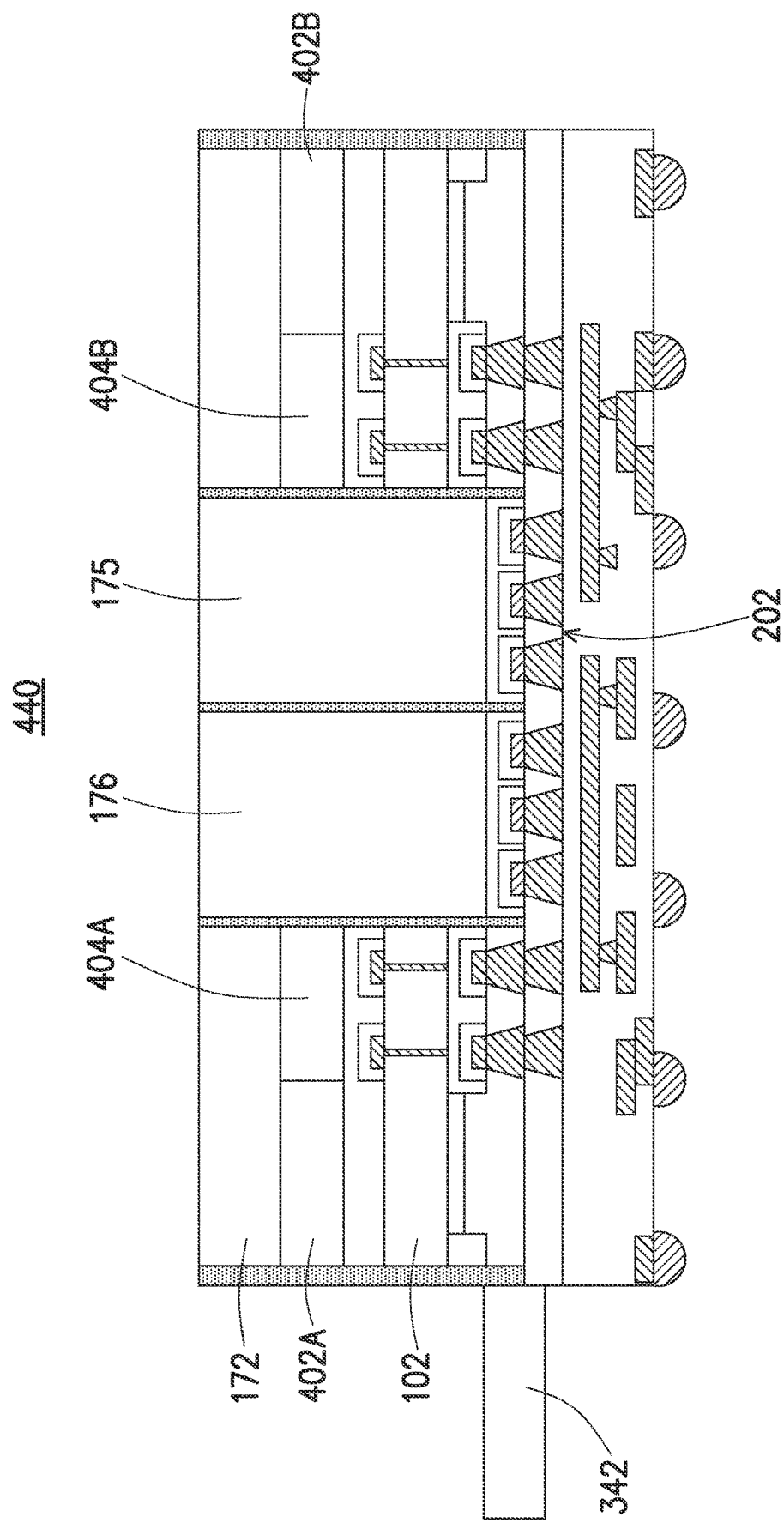
FIG. 4C illustrates the SiPh structure per FIG. 3C with a modification to the electrical integrated circuit, in accordance with some embodiments of the present disclosure.

FIG. 4C illustrates a SiPh structure 440 which is similar to the SiPh structure 340 of FIG. 3C but with a modification to the electrical integrated circuit, in accordance with some embodiments of the present disclosure. As discussed relative to FIG. 3C, fiber 342 is coupled directly to the PWG bridging layer 202. PWG bridging layer 202 comprises PWG 165 and PWG 205. The electrical integrated circuit modification is essentially the same as for SiPh structure 400 per FIG. 4A. The length of EIC 104 is reduced, as illustrated by EIC 404A and EIC 404B. For this embodiment, the addition of filling gaps 402A and 402B do not impact the light penetration, but the additions are beneficial as a heat sink for EICs or ASICs.

Figure 5:
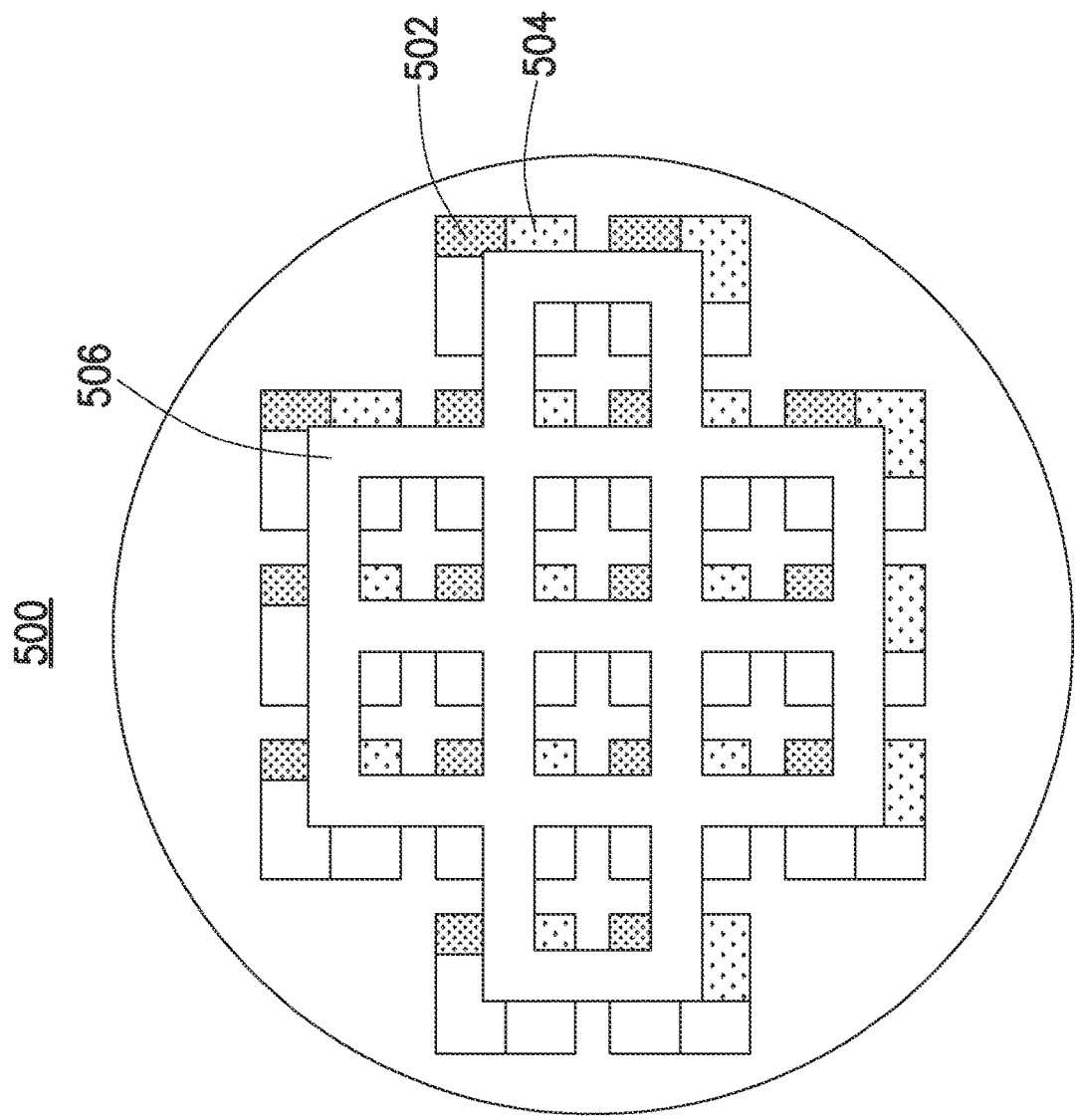
FIG. 5 illustrates a wafer-level system with PWG connecting PICs on a wafer carrier, in accordance with some embodiments of the present disclosure.

FIG. 5 illustrates a wafer-level system 500 with one or more PWGs connecting PICs on a wafer carrier, in accordance with some embodiments of the present disclosure. The method utilizes the same process flow as previously described, except chips (or die) are bonded on a carrier before PWG forming. The carrier can be glass, silicon, metal, polymer, epoxy-molding-compound or diamond, in accordance with various embodiments. As illustrated, chips are formed on a wafer, such as a 12 inch wafer to form a system on wafer (SOW). As illustrated, each square represents a chip with a plurality of components including a PIC 502 and an EIC 504. Each chip may comprise different functions based on the design of the PICs and EICs and other design elements. Utilizing chips based on SiPh structure 210 of FIG. 2B, the chips are coupled by a PWG 506. As an optical waveguide, PWG 506 provides faster communications, transmit longer distances and with a more compact structure as compared with electrical connections. With space and signal loss issues, a wafer-level system based on electrical connections alone may require amplifiers or other components that may be avoided with the use of PWGs.

Figure 6:
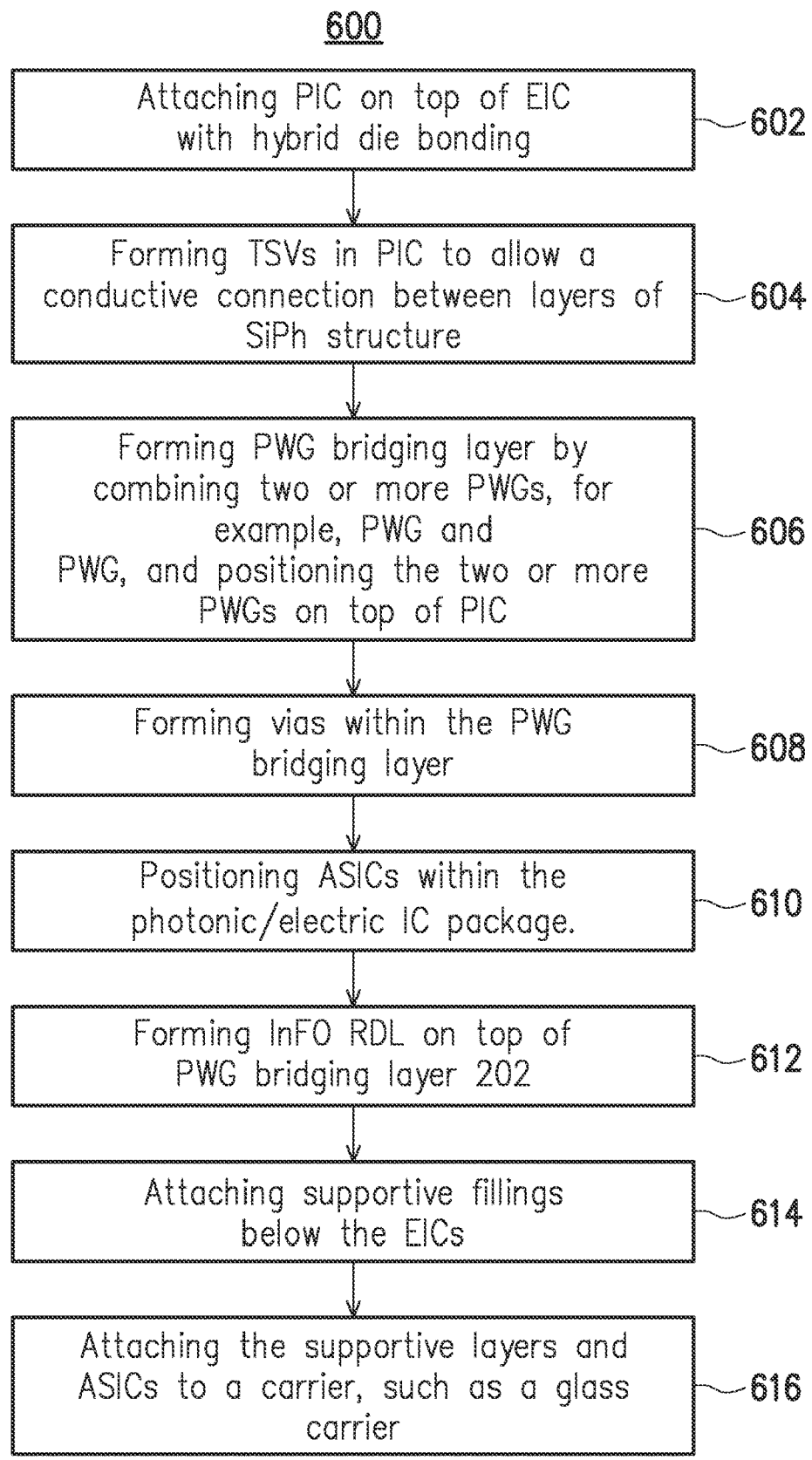
FIG. 6 illustrates a flow chart of an exemplary method for making an exemplary SiPh structure of a photonic/electric IC package by using polymer waveguides, in accordance with some embodiments of the present disclosure.

FIG. 6 illustrates a flow chart 600 of an exemplary method for making an exemplary SiPh structure of a photonic/ electric IC package by using polymer waveguides, in accordance with some embodiments of the present disclosure. The exemplary method disclosed below recites the process flow steps for making the SiPh structure 210 as FIG. 2B as one example. The exemplary method comprises the following steps: attaching PIC 102 on top of EIC 104 with hybrid die bonding. A passive layer 114A is disposed between PIC 102 and EIC (step 602); forming TSVs in PIC 102 to allow a conductive connection between layers of SiPh structure 210, for example, cladding layer 106A and the passivation layer 114A (step 604); forming PWG bridging layer 202 by combining two or more PWGs, for example, PWG 165 and PWG 205, and positioning the two or more PWGs on top of PIC 102 (step 606); forming vias within the PWG bridging layer 202 (step 608); positioning ASICs within the photonic/electric IC package (step 610); forming InFO RDL 211 on top of PWG bridging layer 202 (step 612); attaching supportive fillings below the EICs (step 614); and attaching the supportive fillings and ASICs to a carrier, such as a glass carrier (step 616).

The order of the steps in flow chart 600 can be changed according to various embodiments of the present disclosure.

In one exemplary embodiment, a silicon photonic (SiPh) structure is disclosed. This embodiment comprises an electrical integrated circuit (EIC); a photonic integrated circuit (PIC) disposed on top of the EIC, two or more or more polymer waveguides (PWGs) disposed on top of the PIC and forming a polymer bridging layer, where each of the two or more PWGs comprise a core layer comprising a first polymer. At least two cladding layers comprising a second polymer border the core layer. The SiPh structure also comprises an integration fan-out redistribution (InFO RDL) layer disposed on top of the two or more PWGs. If a refractive index based on the second polymer is less than a refractive index of the first polymer, a light signal propagates through the core layer and at least one of the first polymer and the second polymer can be modified to change their respective refractive indexes. Layers of the first polymer and the second polymer can be patterned by lithography to facilitate implementation of waveguide patterns, via holes and concave/bump topology. The SiPh structure comprises through PWG vias formed between PWG layers to provide inter-layer electrical connections and silicon vias (TSVs) that provide electrical connections between a layers of the SiPh structure. The SiPh structure can further comprise an inter-layer optical signal coupler, operable for transferring a light signal from one core layer to another core layer through one cladding layer. The inter-layer optical signal coupler can be fabricated with a grating coupler with each grating structure formed in the one core layer and another core layer positioned between the one cladding layer. The inter-layer optical signal coupler can also be fabricated with concave/bump topology that is formed on surfaces of the layers of the first polymer and the second polymer. The inter-layer optical signal coupler can also be fabricated with a reflective prism that is formed by changing a refractive index in at least one of the two or more PWGs.

In another embodiment, a wafer-level system comprises a wafer carrier; a plurality of die disposed on the wafer, wherein each of the plurality of die comprise at least one photonic integrated circuit (PICs) and at least one electrical integrated circuit (EIC); a polymer waveguide coupled to the at least one PICs to provide inter-die optical interconnections; and an integration fan-out redistribution (InFO RDL) layer disposed on top of each of the plurality of die. The plurality of die are bonded on the wafer carrier before polymer waveguide formation. The wafer carrier comprises glass, silicon, metal, polymer, epoxy-molding-compound, or diamond.

In yet another embodiment, a method for fabricating a SiPh structure using polymer waveguides can include the steps of: attaching a phonetic integrated circuit (PIC) on top of an electrical integrated circuit (EIC) with hybrid di bonding, wherein a passive layer 114A is disposed between PIC 102 and EIC; forming through-silicon vias (TSVs) in the PIC to allow a conductive connection between cladding layers and a passivation layer; forming a polymer waveguide (PWG) bridging layer comprising two or more PWGs, on top of the PIC; forming vias within the PWGs of PWG bridging layer; positioning ASICs within the photonic/electric IC package; forming an integrated fan-out redistribution layer (InFO RDL) on top of the PWG bridging layer; attaching supportive fillings beneath the EIC; and attaching the supportive fillings and ASICS to a carrier, such as a glass carrier.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A silicon photonic (SiPh) structure comprising:
an electrical integrated circuit (EIC);
a photonic integrated circuit (PIC) disposed on top of the EIC;
at least one polymer waveguide (PWG) disposed on top of the PIC and forming a polymer bridging layer, wherein the at least one PWG comprises a core layer comprising a first polymer and at least two cladding layers comprising a second polymer that surrounds the core layer;
an integration fan-out redistribution (InFO RDL) layer disposed on top of the at least one PWG;
at least one optical lens configured to direct a light signal through the InFO RDL layer; and
a SiPh grating coupler comprising first and second grating structures, respectively, wherein light from the at least one optical lens is received by the first grating structure, which changes a direction of the light so that the light is collected by the second grating structure so as to direct light between the PIC and the at least one PWG.

2. The SiPh structure of claim 1, wherein a polymer used in the at least one PWG is designed for a refractive index range of 1.3 to 2.0.

3. The SiPh structure of claim 1, wherein at least one of the first polymer and the second polymer is modified to change their respective refractive indexes.

4. The SiPh structure of claim 1, wherein layers of the first polymer and the second polymer are patterned by lithography to facilitate implementation of waveguide patterns, via holes and concave/bump topology.

5. The SiPh structure of claim 1, further comprises through PWG vias formed between PWG layers to provide inter-layer electrical connections.

6. The SiPh structure of claim 1, wherein the at least one PWG comprises a first PWG and a second PWG formed above the first PWG, and the SiPH structure further comprises an inter-layer optical signal coupler, operable for transferring a light signal from a first core layer of the first PWG to second core layer of the second PWG through at least one cladding layer.

7. The SiPh structure of claim 6, wherein the inter-layer optical signal coupler comprises a grating coupler having a first grating structure formed in the one core layer and a second grating structure formed in the another core layer.

8. The SiPh structure of claim 6, wherein the inter-layer optical signal coupler is fabricated with concave/bump topology that is formed on surfaces of the layers of the first polymer and the second polymer.

9. The SiPh structure of claim 6, wherein the inter-layer optical signal coupler is fabricated with reflective prisms in the two or more PWGs, wherein the reflective prisms are formed by changing refractive indexes in at least one of the first and second PWGs.

10. The SiPh structure of claim 1, further comprising through-silicon vias (TSVs) that provide electrical connections between two or more layers of the SiPh structure.

11. The SiPh structure of claim 1, wherein the core layer has a funnel-shape and the cladding layer borders the funnel-shape of the core layer, and a narrower end of the funnel-shaped core layer projects through the first cladding layer to provide a reflective prism.

12. The SiPh structure of claim 1, further comprising a fiber, wherein the fiber is coupled to the optical lens which directs a light signal from the fiber through a supportive filling, the EIC and the PIC to the SiPh grating coupler.

13. The SiPh structure of claim 1, wherein a fiber is coupled to the optical lens which directs a light signal through the InFO RDL layer and the polymer bridging layer to the SiPh grating coupler.

14. The SiPh structure of claim 13, wherein the optical lens is formed with polymer and silicon.

15. The SiPh structure of claim 13, wherein the at least one optical lens is formed with polymer and silicon.

16. The SiPh structure of claim 1, further comprising a fiber coupled to the polymer bridging layer.

17. A wafer-level system comprising:
a wafer carrier;
a plurality of dies disposed on the wafer carrier, wherein each of the plurality of dies comprise at least one photonic integrated circuit (PIC) and at least one electrical integrated circuit (EIC);
a polymer waveguide coupled to the at least one PIC to provide inter-die optical interconnections;
an integration fan-out redistribution (InFO RDL) layer disposed on top of each of the plurality of dies, wherein the plurality of dies are bonded on the wafer carrier before polymer waveguide formation;
at least one optical lens configured to direct a light signal from an external source through the InFO RDL layer; and
a SiPh grating coupler comprising first and second grating structures, respectively, wherein light from the at least one optical lens is received by the first grating structure, which changes a direction of the light so that the light is collected by the second grating structure so as to direct light between the PIC and the PWG.

18. The wafer-level system of claim 17, wherein the wafer carrier comprises at least one of: glass, silicon, metal, polymer, epoxy-molding-compound, or diamond.

19. A silicon photonic (SiPh) structure comprising:
an electrical integrated circuit (EIC);
a photonic integrated circuit (PIC) disposed on top of the EIC;
a first polymer waveguide (PWG) disposed on top of the PIC, wherein the first PWG comprises a first core layer comprising a first polymer and at least two cladding layers comprising a second polymer that surrounds the core layer;
a second PWG disposed on top of the first PWG, wherein the second PWG comprises a second core layer comprising a third polymer and at least two second cladding layers comprising a fourth polymer that surrounds the second core layer;
at least one optical lens configured to direct a light signal from an external source through the first and second PWGs; and
a SiPh grating coupler disposed between the PIC and the first PWG, the SiPh grating coupler comprising first and second grating structures, respectively, wherein light from the at least one optical lens is received by the first grating structure, which changes a direction of the light so that the light is collected by the second grating structure so as to direct light between the PIC and the first PWG.

20. The SiPh structure of claim 19, further comprising an integration fan-out redistribution (InFO RDL) layer disposed on top of the second PWG, wherein the external source comprises a fiber, and wherein the fiber is coupled to the at least one optical lens which directs the light from the fiber through the InFO RDL layer, and the first and second PWGs to the SiPh grating coupler.

* * * * *